United States Patent
Greeson et al.

(10) Patent No.: US 9,795,060 B2
(45) Date of Patent: *Oct. 17, 2017

(54) MODULAR THERMAL ISOLATION BARRIER FOR DATA PROCESSING EQUIPMENT STRUCTURE

(71) Applicant: CHATSWORTH PRODUCTS, INC., Westlake Village, CA (US)

(72) Inventors: Joshua Blaine Greeson, Austin, TX (US); Steven J. Gibble, Cedar Park, TX (US); Joshua James Young, Austin, TX (US); Jared Keith Davis, Cedar Park, TX (US)

(73) Assignee: Chatsworth Products, Inc., Agoura Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/424,804

(22) Filed: Feb. 4, 2017

(65) Prior Publication Data

US 2017/0150652 A1    May 25, 2017

Related U.S. Application Data

(63) Continuation of application No. 14/866,913, filed on Sep. 26, 2015, now Pat. No. 9,572,286, which is a
(Continued)

(51) Int. Cl.
*H05K 7/20* (2006.01)
*H05K 7/14* (2006.01)
(Continued)

(52) U.S. Cl.
CPC ..... *H05K 7/20709* (2013.01); *A47B 47/0041* (2013.01); *A47B 96/1466* (2013.01);
(Continued)

(58) Field of Classification Search
CPC . E04B 1/66; E04B 1/68; E04B 1/6803; E04B 1/6806; E04B 1/6809;
(Continued)

(56) References Cited

U.S. PATENT DOCUMENTS 2,424,217 A    7/1947   Bales
2,766,861 A    10/1956  Abramson
(Continued)

FOREIGN PATENT DOCUMENTS

AU    2008254682        11/2012
DE    19615759 A1       10/1997
(Continued)

OTHER PUBLICATIONS

Information Disclosure Statement (IDS) Letter Regarding Common Patent Application(s) dated Mar. 23, 2017.
(Continued)

*Primary Examiner* — Joshua J Michener
*Assistant Examiner* — Matthew Gitlin
(74) *Attorney, Agent, or Firm* — Tillman Wright, PLLC; James D. Wright; David R. Higgins

(57) ABSTRACT

A modular thermal isolation barrier for use in sealing gaps in a data processing equipment structure includes an extruded edge seal and a panel. The extruded edge seal has a seal portion and a base portion with one or more channels. An edge of the panel is disposed within one of the one or more channels of the base portion of the edge seal such that the edge seal is seated against the edge of the panel with the seal portion in position to abut, and establish a seal with, an adjacent structure.

20 Claims, 18 Drawing Sheets

Related U.S. Application Data continuation of application No. 14/154,016, filed on Jan. 13, 2014, now abandoned.

(60) Provisional application No. 61/751,260, filed on Jan. 11, 2013, provisional application No. 61/751,254, filed on Jan. 11, 2013.

(51) Int. Cl.

| | | |
|---|---|---|
| H05K 7/18 | (2006.01) | |
| A47B 47/00 | (2006.01) | |
| A47B 96/20 | (2006.01) | |
| A47B 96/14 | (2006.01) | |
| E04B 1/66 | (2006.01) | |
| E04B 1/19 | (2006.01) | |

(52) U.S. Cl.
CPC .............. *A47B 96/20* (2013.01); *E04B 1/19* (2013.01); *E04B 1/66* (2013.01); *H05K 7/1488* (2013.01); *H05K 7/18* (2013.01); *E04B 2001/199* (2013.01)

(58) Field of Classification Search
CPC .... E04B 1/6812; E04B 1/6813; E04B 1/6815; B60J 10/24; B60J 10/33; B60J 10/80; B60J 10/16; B60J 10/25; H05K 7/20709; H05K 7/1488; H05K 7/1497; H05K 7/20836; H05K 2001/405
USPC .............................................. 52/404.2, 582.1
See application file for complete search history.

(56) References Cited

U.S. PATENT DOCUMENTS

| | | | |
|---|---|---|---|
| 3,034,844 A | 5/1962 | Anderson et al. | |
| 3,143,195 A | 8/1964 | Schroeder | |
| 3,265,419 A | 8/1966 | Durnbaugh et al. | |
| 3,404,931 A | 10/1968 | Fall et al. | |
| 3,563,627 A | 2/1971 | Whipps | |
| 3,707,060 A | 12/1972 | Jansen, Jr. | |
| 3,789,567 A | 2/1974 | Rae et al. | |
| 3,919,603 A | 11/1975 | Salvati et al. | |
| 3,972,167 A * | 8/1976 | Vogeli ................ E04B 1/61 52/241 | |
| 3,975,877 A | 8/1976 | Walton | |
| 4,117,640 A * | 10/1978 | Vanderstar .......... E06B 3/26338 49/DIG. 1 | |
| 4,186,539 A | 2/1980 | Harmon et al. | |
| 4,251,968 A * | 2/1981 | Raith .................. E04B 2/7401 52/471 | |
| 4,467,584 A | 8/1984 | Crites et al. | |
| 4,495,234 A | 1/1985 | Tominaga et al. | |
| 4,541,219 A | 9/1985 | Parker | |
| 4,544,069 A * | 10/1985 | Cavallini ................ H02B 1/01 211/183 | |
| 4,635,422 A | 1/1987 | Nowack et al. | |
| 4,652,695 A * | 3/1987 | Busby ................ H05K 9/0015 174/354 | |
| 4,659,869 A * | 4/1987 | Busby ................ H05K 9/0015 174/354 | |
| 4,691,970 A * | 9/1987 | Neri ................... A47B 47/0008 312/140 | |
| 4,705,916 A * | 11/1987 | Wadhera ............. H05K 9/0015 174/367 | |
| 4,715,502 A | 12/1987 | Salmon | |
| 4,768,845 A * | 9/1988 | Yeh ................... A47B 47/0008 312/257.1 | |
| 4,824,289 A | 4/1989 | Glang et al. | |
| 4,852,317 A | 8/1989 | Schiavello et al. | |
| 4,864,076 A * | 9/1989 | Stickney ............. H05K 9/0016 174/355 | |
| 4,999,960 A | 3/1991 | Herwegh et al. | |
| 5,020,866 A | 6/1991 | McIlwraith | |
| 5,086,599 A | 2/1992 | Meyerson | |
| 5,147,121 A | 9/1992 | McIlwraith | |
| RE34,393 E | 9/1993 | McIlwraith | |
| 5,250,752 A | 10/1993 | Cutright | |
| 5,275,296 A | 1/1994 | Zachrai | |
| 5,284,254 A | 2/1994 | Rinderer | |
| 5,294,748 A | 3/1994 | Schwenk et al. | |
| 5,323,916 A | 6/1994 | Salmon | |
| 5,333,950 A | 8/1994 | Zachrai | |
| 5,380,083 A | 1/1995 | Jones et al. | |
| 5,448,865 A | 9/1995 | Palmersten | |
| 5,498,073 A | 3/1996 | Charbonneau et al. | |
| 5,566,836 A | 10/1996 | Lerman | |
| 5,566,954 A | 10/1996 | Hahn | |
| 5,586,012 A | 12/1996 | Lerman | |
| 5,613,338 A * | 3/1997 | Esposito ................ E04B 7/22 52/309.14 | |
| 5,639,150 A | 6/1997 | Anderson et al. | |
| 5,695,263 A | 12/1997 | Simon et al. | |
| 5,791,498 A | 8/1998 | Mills | |
| 5,806,945 A | 9/1998 | Anderson et al. | |
| 5,899,545 A | 5/1999 | Besserer et al. | |
| 5,938,302 A | 8/1999 | Anderson et al. | |
| 5,957,506 A | 9/1999 | Stepp | |
| 5,983,590 A | 11/1999 | Serban | |
| 5,997,117 A | 12/1999 | Krietzman | |
| 6,006,925 A | 12/1999 | Sevier | |
| 6,019,446 A | 2/2000 | Laboch et al. | |
| 6,036,290 A | 3/2000 | Jancsek et al. | |
| 6,047,838 A | 4/2000 | Rindoks et al. | |
| 6,082,837 A | 7/2000 | Battochio et al. | |
| 6,123,400 A | 9/2000 | Nicolai et al. | |
| D433,615 S | 11/2000 | Neider et al. | |
| 6,142,594 A | 11/2000 | Benner et al. | |
| 6,179,398 B1 | 1/2001 | Martin | |
| 6,223,908 B1 | 5/2001 | Kurtsman | |
| 6,238,029 B1 | 5/2001 | Marzec et al. | |
| 6,240,687 B1 | 6/2001 | Chong | |
| 6,279,756 B1 | 8/2001 | Walter | |
| 6,321,917 B1 | 11/2001 | Mendoza | |
| 6,338,413 B1 | 1/2002 | Walter et al. | |
| 6,349,837 B1 | 2/2002 | Serban | |
| 6,401,940 B1 | 6/2002 | Hartel et al. | |
| 6,419,331 B2 | 7/2002 | Wei | |
| 6,478,166 B2 | 11/2002 | Hung | |
| 6,481,582 B1 | 11/2002 | Rinderer | |
| 6,515,225 B1 | 2/2003 | Wright | |
| 6,517,174 B2 | 2/2003 | Sevier | |
| 6,527,351 B1 | 3/2003 | Sevier et al. | |
| 6,541,705 B1 | 4/2003 | McGrath | |
| 6,561,602 B1 | 5/2003 | Sevier et al. | |
| 6,598,270 B2 | 7/2003 | Larsen et al. | |
| 6,616,524 B2 | 9/2003 | Storck, Jr. et al. | |
| 6,655,533 B2 | 12/2003 | Guebre-Tsadik | |
| 6,695,149 B1 | 2/2004 | Cote et al. | |
| 6,702,125 B2 | 3/2004 | Hartel | |
| 6,785,459 B2 | 8/2004 | Schmidt et al. | |
| 6,788,535 B2 | 9/2004 | Dodgen et al. | |
| 6,820,952 B2 * | 11/2004 | Austin ................ F24F 3/0442 312/265.1 | |
| 6,859,366 B2 | 2/2005 | Fink | |
| 6,945,616 B2 | 9/2005 | Webster et al. | |
| 6,951,288 B2 | 10/2005 | Henderson | |
| 6,980,433 B2 | 12/2005 | Fink | |
| 7,022,008 B1 | 4/2006 | Crocker | |
| 7,033,267 B2 | 4/2006 | Rasmussen | |
| 7,046,514 B2 | 5/2006 | Fink et al. | |
| 7,112,131 B2 | 9/2006 | Rasmussen et al. | |
| 7,144,320 B2 | 12/2006 | Turek et al. | |
| 7,145,772 B2 | 12/2006 | Fink | |
| 7,172,078 B2 | 2/2007 | Abby et al. | |
| 7,173,820 B2 | 2/2007 | Fink et al. | |
| 7,219,809 B2 | 5/2007 | Schluter et al. | |
| 7,255,640 B2 | 8/2007 | Aldag et al. | |
| 7,259,963 B2 | 8/2007 | Germagian et al. | |
| 7,293,666 B2 | 11/2007 | Mattlin et al. | |
| 7,364,243 B2 | 4/2008 | Wyatt et al. | |
| 7,425,678 B2 | 9/2008 | Adducci et al. | |
| 7,427,713 B2 | 9/2008 | Adducci et al. | |

(56) References Cited

U.S. PATENT DOCUMENTS

| | | |
|---|---|---|
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| 7,498,512 B2 | 3/2009 | Adducci et al. |
| 7,500,911 B2 | 3/2009 | Johnson et al. |
| 7,504,581 B2 | 3/2009 | Adducci et al. |
| 7,529,086 B2 | 5/2009 | Fink et al. |
| 7,542,287 B2 | 6/2009 | Lewis, II et al. |
| 7,592,541 B2 | 9/2009 | Adducci et al. |
| 7,608,779 B2 | 10/2009 | Adducci et al. |
| 7,643,291 B2 | 1/2010 | Mallia et al. |
| 7,656,660 B2 | 2/2010 | Hoeft et al. |
| 7,667,135 B2 | 2/2010 | Adducci et al. |
| 7,684,193 B2 | 3/2010 | Fink et al. |
| 7,697,285 B2 | 4/2010 | Donowho et al. |
| 7,718,891 B2 | 5/2010 | Adducci et al. |
| 7,746,637 B2 | 6/2010 | Donowho et al. |
| 7,752,858 B2 | 7/2010 | Johnson et al. |
| 7,764,495 B2 | 7/2010 | Hruby et al. |
| 7,772,489 B2 | 8/2010 | Adducci et al. |
| 7,781,675 B2 | 8/2010 | Adducci et al. |
| 7,795,532 B2 | 9/2010 | Walker |
| 7,804,685 B2 | 9/2010 | Krietzman |
| 7,839,635 B2 | 11/2010 | Donowho et al. |
| 7,874,433 B2 | 1/2011 | Levesque et al. |
| 7,878,888 B2 | 2/2011 | Rasmussen et al. |
| 7,880,084 B2 | 2/2011 | Adducci et al. |
| 7,881,057 B2 | 2/2011 | Fink et al. |
| 7,894,190 B2 | 2/2011 | Davis et al. |
| 7,895,855 B2 | 3/2011 | Gooch |
| 7,952,869 B2 | 5/2011 | Lewis, II et al. |
| 7,957,139 B2 | 6/2011 | Davis et al. |
| 7,974,105 B2 | 7/2011 | Dean, Jr. et al. |
| 8,035,965 B2 | 10/2011 | Adducci et al. |
| 8,040,673 B2 | 10/2011 | Krietzman |
| 8,087,979 B2 | 1/2012 | Rasmussen |
| 8,107,238 B2 * | 1/2012 | Krietzman ......... H05K 7/20745 165/104.19 |
| 8,237,052 B2 | 8/2012 | Adducci et al. |
| 8,395,046 B2 | 3/2013 | Nicewicz et al. |
| 8,395,891 B2 * | 3/2013 | Noteboom ......... H05K 7/20745 165/104.33 |
| 8,403,736 B2 | 3/2013 | Rasmussen et al. |
| 8,405,984 B2 | 3/2013 | Donowho et al. |
| 8,411,465 B2 | 4/2013 | Dean, Jr. et al. |
| 8,424,691 B2 | 4/2013 | McMillan, III et al. |
| 8,437,147 B2 | 5/2013 | Dean, Jr. et al. |
| 8,459,756 B2 | 6/2013 | Linhares et al. |
| 8,533,999 B2 | 9/2013 | Otsuka et al. |
| D697,640 S * | 1/2014 | Ksiezopolski ............... D25/124 |
| 8,628,158 B2 | 1/2014 | Caveney |
| 8,653,363 B2 | 2/2014 | Behrens et al. |
| 8,730,665 B2 | 5/2014 | Lewis, II et al. |
| 8,737,068 B2 | 5/2014 | Krietzman et al. |
| 8,787,023 B2 | 7/2014 | Lewis, II et al. |
| 8,901,438 B2 | 12/2014 | Lewis, II et al. |
| 9,055,677 B2 | 6/2015 | Garza, Jr. et al. |
| 9,072,200 B2 | 6/2015 | Dersch et al. |
| 9,119,329 B2 | 8/2015 | Krietzman et al. |
| 9,204,577 B2 | 12/2015 | Noteboom et al. |
| 9,313,927 B2 | 4/2016 | Krietzman |
| 9,351,427 B2 | 5/2016 | Lewis, II et al. |
| 9,420,727 B2 | 8/2016 | Lewis, II et al. |
| 9,549,487 B2 | 1/2017 | Lewis, II et al. |
| 9,560,777 B2 | 1/2017 | Krietzman et al. |
| 9,572,286 B2 | 2/2017 | Greeson et al. |
| 9,655,259 B2 | 5/2017 | North et al. |
| 2002/0172013 A1 | 11/2002 | Chandler |
| 2004/0069725 A1 | 4/2004 | Adducci et al. |
| 2004/0183409 A1 | 9/2004 | Rinderer |
| 2004/0190270 A1 | 9/2004 | Aldag et al. |
| 2004/0201335 A1 | 10/2004 | Davis |
| 2006/0043031 A1 | 3/2006 | Rinderer |
| 2006/0082263 A1 | 4/2006 | Rimler et al. |
| 2006/0103270 A1 | 5/2006 | Bergesch et al. |
| 2006/0141921 A1 | 6/2006 | Turek et al. |
| 2006/0144572 A1 | 7/2006 | Yu et al. |
| 2006/0213853 A1 | 9/2006 | Schluter et al. |
| 2006/0243680 A1 | 11/2006 | Levesque et al. |
| 2006/0288651 A1 | 12/2006 | Zeng et al. |
| 2007/0044416 A1 | 3/2007 | Van Dijk |
| 2007/0064389 A1 | 3/2007 | Lewis, II et al. |
| 2007/0064391 A1 | 3/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0251183 A1 | 11/2007 | Thiagarajan et al. |
| 2007/0293138 A1 | 12/2007 | Adducci et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0074849 A1 | 3/2008 | Adducci et al. |
| 2008/0134745 A1 | 6/2008 | Hermanson |
| 2008/0156946 A1 | 7/2008 | Schmutzer |
| 2008/0174217 A1 | 7/2008 | Walker |
| 2008/0266789 A1 | 10/2008 | Hruby et al. |
| 2008/0316702 A1 | 12/2008 | Donowho et al. |
| 2008/0316703 A1 | 12/2008 | Donowho et al. |
| 2009/0059523 A1 | 3/2009 | Mallia et al. |
| 2009/0061755 A1 | 3/2009 | Calder et al. |
| 2009/0129013 A1 | 5/2009 | Donowho et al. |
| 2009/0190307 A1 | 7/2009 | Krietzman |
| 2009/0227197 A1 | 9/2009 | Lewis, II et al. |
| 2009/0239461 A1 | 9/2009 | Lewis, II et al. |
| 2009/0273915 A1 | 11/2009 | Dean, Jr. et al. |
| 2009/0283488 A1 | 11/2009 | McMillan, III et al. |
| 2010/0061057 A1 | 3/2010 | Dersch et al. |
| 2010/0061059 A1 | 3/2010 | Krietzman et al. |
| 2010/0096105 A1 * | 4/2010 | Novotny ............ H05K 7/20736 165/80.2 |
| 2010/0172092 A1 | 7/2010 | Davis et al. |
| 2010/0172093 A1 | 7/2010 | Davis et al. |
| 2010/0188816 A1 | 7/2010 | Bean et al. |
| 2010/0216388 A1 | 8/2010 | Tresh et al. |
| 2010/0307716 A1 | 12/2010 | Bean et al. |
| 2011/0019362 A1 | 1/2011 | Krietzman |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2011/0271610 A1 | 11/2011 | Cottuli et al. |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0015553 A1 | 1/2012 | Rosendahl |
| 2012/0062083 A1 | 3/2012 | Lewis, II et al. |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0112612 A1 | 5/2012 | Krietzman |
| 2012/0145655 A1 | 6/2012 | McMillan, III et al. |
| 2012/0181906 A1 | 7/2012 | Caveney |
| 2012/0194999 A1 | 8/2012 | Krietzman et al. |
| 2012/0267991 A1 | 10/2012 | Adducci et al. |
| 2013/0088833 A1 * | 4/2013 | Cox ................ H05K 7/20736 361/689 |
| 2013/0149954 A1 | 6/2013 | North et al. |
| 2013/0160271 A1 | 6/2013 | Krietzman et al. |
| 2013/0165035 A1 | 6/2013 | Krietzman et al. |
| 2013/0210335 A1 | 8/2013 | Krietzman et al. |
| 2014/0132134 A1 | 5/2014 | Garza, Jr. et al. |
| 2014/0196394 A1 | 7/2014 | Greeson et al. |
| 2015/0173253 A1 | 6/2015 | Lewis, II et al. |
| 2015/0250071 A1 | 9/2015 | Garza, Jr. et al. |
| 2015/0264839 A1 | 9/2015 | Lewis, II et al. |
| 2015/0282390 A1 | 10/2015 | Lewis, II et al. |
| 2015/0319872 A1 | 11/2015 | Lewis, II et al. |
| 2016/0088773 A1 | 3/2016 | Greeson et al. |
| 2016/0249488 A1 | 8/2016 | Krietzman |

(56) References Cited

U.S. PATENT DOCUMENTS

| | | |
|---|---|---|
| 2017/0127570 A1 | 5/2017 | Lewis, II et al. |
| 2017/0142851 A1 | 5/2017 | Krietzman et al. |
| 2017/0150652 A1 | 5/2017 | Greeson et al. |

FOREIGN PATENT DOCUMENTS

| | | |
|---|---|---|
| EP | 2205054 A1 | 7/2010 |
| EP | 2429271 | 3/2012 |
| EP | 2429272 | 3/2012 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009089307 A2 | 7/2009 |
| WO | 2009103090 A2 | 8/2009 |
| WO | 2009103090 A3 | 10/2009 |
| WO | 2009143193 A2 | 11/2009 |
| WO | 2009089307 A3 | 12/2009 |
| WO | 2009143193 A3 | 3/2010 |
| WO | 2010028384 A2 | 3/2010 |
| WO | 2010028384 A3 | 5/2010 |
| WO | 2010117699 A1 | 10/2010 |

OTHER PUBLICATIONS

Chatsworth Products, Inc., "Thermal Management Solutions," Signature Solutions Brochure, revision dated Mar. 2008, www.chatsworth.com/passivecooling (6 pages).

DCR Product Brochure, accessed at www.datacenterinarow.com, on or about Mar. 2011 (25 pages).

DCR Product Brochure, Configuration Options, accessed at www.datacenterinarow.com, on or about Mar. 2011 (4 pages).

DCR Product Brochure, Top Ten Features, accessed at www.datacenterinarow.com, on or about Mar. 2011 (9 pages).

DCR Product Brochure, Self-Contained Data Center Configurations, accessed at www.datacenterinarow.com, on or about Mar. 2011 (2 pages).

DCR Product Brochure, Self-Contained Data Center Features, accessed at www.datacenterinarow.com, on or about Mar. 2011 (2 pages).

Hewlett-Packard Development Company, LP, HP 10000 G2 42U Rack Air Duct Installation Guide, dated Aug. 2008 (23 pages).

Panduit Corporation, Panduit Net-Access Vertical Exhaust System (VES) Specification Sheet, dated Feb. 2011 (4 pages).

Panduit Corporation, Panduit Net-Access Vertical Exhaust Duct (VED) Instructions, dated 2009 (4 pages).

* cited by examiner

18

MODULAR THERMAL ISOLATION BARRIER FOR DATA PROCESSING EQUIPMENT STRUCTURE

CROSS-REFERENCE TO RELATED APPLICATIONS

The present application is a U.S. continuation patent application of, and claims priority under 35 U.S.C. §120 to, U.S. patent application Ser. No. 14/866,913, filed Sep. 26, 2015, which '913 application published as U.S. Patent Application Publication No. US 2016/0088773 A1 on Mar. 24, 2016 and issued as U.S. Pat. No. 9,572,286 on Feb. 14, 2017, which '913 application, the application publication thereof, and the patent issuing therefrom are each expressly incorporated herein by reference in their entirety, and which '913 application is a U.S. continuation patent application of, and claims priority under 35 U.S.C. §120 to, U.S. patent application Ser. No. 14/154,016, filed Jan. 13, 2014, which '016 application published as U.S. Patent Application Publication No. US 2014/0196394 A1 on Jul. 17, 2014, which '016 application and the application publication thereof are each expressly incorporated herein by reference in their entirety, and which '016 application is a U.S. nonprovisional patent application of, and claims priority under 35 U.S.C. §119(e) to, each of the following U.S. provisional patent applications:

(a) U.S. provisional patent application Ser. No. 61/751,260, filed Jan. 11, 2013 and entitled, "MODULAR THERMAL ISOLATION BARRIER FOR DATA PROCESSING EQUIPMENT STRUCTURES," which '260 application is expressly incorporated herein by reference in its entirety, and a copy of which is attached hereto as Appendix A, which appendix is likewise expressly incorporated herein by reference in its entirety; and (b) U.S. provisional patent application Ser. No. 61/751,254, filed Jan. 11, 2013 and entitled, "DATA PROCESSING EQUIPMENT STRUCTURE," which '254 application is expressly incorporated herein by reference in its entirety, and a copy of which is attached hereto as Appendix B, which appendix is likewise expressly incorporated herein by reference in its entirety.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to structures and methods of thermal management in a data center, and in particular, to housing data processing equipment, and, in particular, to data processing equipment structures that can be structurally altered to seal around additional openings or obstruction to provide enhanced airflow solutions.

Background

Racks, frames and enclosures for mounting and storing computer and other electronic components or equipment have been well known for many years. Racks and frames are typically simple rectangular frameworks on which electronic components may be mounted, or on which other mounting members, such as shelves or brackets, may be mounted which in turn may support the electronic components. Enclosures are typically frames on which panels or doors, or both, are hung to provide aesthetic improvement, to protect the components from external influences, to provide security for the components stored inside, or for other reasons.

Racks, frames and enclosures have been built in many different sizes and with many different proportions in order to best accommodate the components which they are designed to support and store. Components stored in these enclosures may include audio and video equipment and the like, but quite frequently include computer equipment and related peripheral devices. These components typically include housings enclosing internal operative elements.

As is also well known, the electronic equipment mounted in these structures tend to generate large amounts of thermal energy that needs to be exhausted away from the equipment effectively in order to maintain the equipment in proper operating order or to prevent damage thereto. The problem can be especially significant when the components are enclosed in enclosures, because thermal energy generated thereby can concentrate within the equipment enclosure and cause the components to overheat and shut down. As equipment becomes more densely packed with electronics, the quantities of thermal energy have continued to increase in recent years, and thermal energy management has become a significant issue confronting today's rack, frame and enclosure manufacturers, the manufacturers of the electronic equipment, and the users of such equipment.

Typically, multiple racks, frames, enclosures, and the like (sometimes collectively referred to hereinafter as "enclosures") are housed together in a data center room. Because of the overheating problem, and particularly with multiple enclosures being placed in a single room, thermal management of the data center room is very important. A goal of data center thermal management is to maximize the performance, uptime and life expectancy of the active components being housed in the room. Toward this end, data center rooms are often arranged so as to increase efficiency and optimize performance.

One common way of organizing a data center room to meet these objectives involves arranging individual enclosures in rows, with the air intake of each enclosure facing toward one side of the row and the heated air exhaust of each enclosure facing toward the other side of the row. Rows of enclosures are arranged in back-to-back relationship so that enclosures of two separate rows exhaust heated air into a common "hot" aisle between the rows. Heated exhaust air from the hot aisle is then drawn into a cooling unit—often arranged as an in-line unit within the row of enclosures. The cooled air is then deposited back into the ambient space of the data center room to be re-used in the cooling process.

In such an arrangement, however, several drawbacks are known to exist. For instance, the establishment of a hot aisle between rows eliminates the possibility of having dedicated cooling units to manage the cooling process for each row individually. Additionally, under existing hot aisle methodology, the entire space of the data center room must be kept cool in order to provide a ready supply of cooled air available to the enclosure intakes. Due to its typically large volume, the data center room is generally incapable of being adequately pressurized.

Accordingly, a need exists for improvement in the arrangement of equipment enclosures within a data center room so as to further enhance efficiency and performance. This, and other needs, is addressed by one or more aspects of the present invention.

SUMMARY OF THE PRESENT INVENTION

Broadly defined, the present invention according to a first aspect is a data processing equipment structure comprising a plurality of struts and panels, which, together, define an enclosed space.

Broadly defined, the present invention according to another aspect is a data processing equipment structure substantially as shown and described.

Broadly defined, the present invention according to another aspect is a modular thermal isolation barrier for data processing equipment structures as shown and described.

Broadly defined, the present invention according to another aspect is a modular thermal isolation barrier, as shown and described.

Broadly defined, the present invention according to another aspect is an edge seal for a modular thermal isolation barrier, as shown and described.

Broadly defined, the present invention according to another aspect is a modular thermal isolation barrier, including: a panel; and an edge seal arranged along an edge of the panel.

In a feature of this aspect, the modular thermal isolation barrier further includes a rigid support structure coupled along the length of the edge seal.

Broadly defined, the present invention according to another aspect is a data processing equipment structure comprising a plurality of rigid support structures, at least some of the rigid support structures coupled to edge seals that are arranged along the respective edges of panels that define an enclosed space.

Broadly defined, the present invention according to another aspect is an extruded edge seal for a modular thermal isolation barrier, including: a multi-channel base portion; and a bulb seal portion.

In a feature of this aspect, the base portion and bulb seal portion are co-extruded.

In another feature of this aspect, the edge seal further includes panel retention fingers disposed within a channel of the multi-channel base portion.

Broadly defined, the present invention according to another aspect is a modular thermal isolation barrier for use in sealing gaps in a data processing equipment structure. The modular thermal isolation barrier includes an extruded edge seal and a panel. The extruded edge seal has a seal portion and a base portion with one or more channels. An edge of the panel is disposed within one of the one or more channels of the base portion of the edge seal such that the edge seal is seated against the edge of the panel with the seal portion in position to abut, and establish a seal with, an adjacent structure.

In a feature of this aspect, the seal portion may include a bulb-shaped seal for abutting, and establishing a seal with, the adjacent structure.

In other features of this aspect, the bulb-shaped seal may be bifurcated at a distal end; the bulb-shaped seal may include convex and concave portions at a distal end; and/or the bulb-shaped seal may include one or more protrusions at a distal end.

In another feature of this aspect, the base portion and the seal portion of the edge seal may be co-extruded.

In another feature of this aspect, the base portion and the seal portion may be manufactured from different materials.

In another feature of this aspect, the base portion and the seal portion may be manufactured from the same material.

In other features of this aspect, at least one of the one or more channels of the base portion may include a plurality of panel retention fingers for gripping the edge of the panel; and/or the panel retention fingers may extend from sides of the at least one channel at an inwardly-oriented angle.

In other features of this aspect, the base portion may be manufactured from a plastic material; and/or the seal portion may be manufactured from a rubber material.

In another feature of this aspect, the plastic material may be an ABS plastic material.

In another feature of this aspect, the plastic material may be a PVC plastic material.

In another feature of this aspect, the base portion may include a plurality of channels, at least one of which is adapted to fittingly accommodate a separate rigid support structure coupled along the length of the edge seal.

Broadly defined, the present invention according to another aspect is a modular thermal isolation barrier for use in sealing gaps in a data processing equipment structure. The modular thermal isolation barrier includes an edge seal, a panel, and a rigid support structure. The edge seal has a seal portion and a base portion with a plurality of channels. An edge of the panel is disposed within one of the plurality of channels of the base portion of the edge seal such that the edge seal is seated against the edge of the panel with the seal portion in position to abut, and establish a seal with, an adjacent structure. The rigid support structure has a generally uniform cross-sectional shape along its length and is coupled to the edge seal at another of the plurality of channels.

In a feature of this aspect, the seal portion may include a bulb-shaped seal for abutting, and establishing a seal with, the adjacent structure.

In other features of this aspect, the bulb-shaped seal may be bifurcated at a distal end; the bulb-shaped seal may include convex and concave portions at a distal end; and/or the bulb-shaped seal may include one or more protrusions at a distal end.

In another feature of this aspect, the base portion and the seal portion of the edge seal may be co-extruded.

In another feature of this aspect, the base portion and the seal portion may be manufactured from different materials.

In another feature of this aspect, the base portion and the seal portion may be manufactured from the same material.

In other features of this aspect, at least one of the plurality of channels of the base portion may include a plurality of panel retention fingers for gripping the edge of the panel; and/or the panel retention fingers may extend from sides of the at least one channel at an inwardly-oriented angle.

In other features of this aspect, the base portion may be manufactured from a plastic material; and/or the seal portion may be manufactured from a rubber material.

In another feature of this aspect, the plastic material may be an ABS plastic material.

In another feature of this aspect, the plastic material may be a PVC plastic material.

In other features of this aspect, the rigid support structure may include a pair of opposed retention flanges for coupling the rigid support structure to the edge seal; the rigid support structure may include a plurality of channels extending along its length, at least one of which is ridged to accommodate a threaded fastener; and/or the rigid support structure may be attachable to other support members of the data processing equipment structure.

Broadly defined, the present invention according to another aspect is an extruded edge seal for a modular thermal isolation barrier. The extruded edge seal includes a base portion and a bulb-shaped seal portion. The base portion includes a plurality of channels, at least one of which is adapted to fittingly accommodate an edge of a panel. The bulb-shaped seal portion is attached to the base portion and adapted to abut, and establish a seal with, an adjacent structure.

In features of this aspect, the bulb-shaped seal portion may be bifurcated at a distal end; the bulb-shaped seal portion may include convex and concave portions at a distal end; and/or the bulb-shaped seal portion includes one or more protrusions at a distal end.

In another feature of this aspect, the base portion and the bulb-shaped seal portion of the edge seal may be co-extruded.

In another feature of this aspect, the base portion and the bulb-shaped seal portion may be manufactured from different materials.

In another feature of this aspect, the base portion and the bulb-shaped seal portion may be manufactured from the same material.

In other features of this aspect, at least one of the plurality of channels of the base portion may include a plurality of panel retention fingers for gripping the edge of the panel; and/or the panel retention fingers may extend from sides of the at least one channel at an inwardly-oriented angle.

In other features of this aspect, the base portion may be manufactured from a plastic material; and/or the bulb-shaped seal portion may be manufactured from a rubber material.

In another feature of this aspect, the plastic material may be an ABS plastic material.

In another feature of this aspect, the plastic material may be a PVC plastic material.

In another feature of this aspect, at least one of the plurality of channels of the base portion may be adapted to fittingly accommodate a separate rigid support structure coupled along the length of the base portion.

Broadly defined, the present invention according to another aspect is a data processing equipment structure. The data processing equipment structure includes a plurality of vertical and horizontal frame components, which, together, define an equipment structure frame, a plurality of panels disposed relative to the equipment structure frame to define a periphery, an enclosure, and one or more modular thermal isolation barriers. A portion of the enclosure is located inside the periphery and a portion of the enclosure is located outside the periphery such that a gap exists between the enclosure and an adjacent one of the plurality of vertical and horizontal frame components of the equipment structure frame. Each of the one or more modular thermal isolation barriers includes a barrier panel and an edge seal, disposed relative to the equipment structure frame such that the edge seal abuts, and establishes a seal with, the enclosure, thereby thermally sealing the gap.

In a feature of this aspect, at least one of the plurality of vertical and horizontal frame components may be an extruded rigid support structure.

In another feature of this aspect, at least one of the plurality of vertical and horizontal frame components may include an extruded rigid support structure coupled therewith.

In another feature of this aspect, the edge seal may include a seal portion and a base portion with one or more channels.

In another feature of this aspect, the seal portion may include a bulb-shaped seal for abutting, and establishing a seal with, the enclosure.

In other features of this aspect, the bulb-shaped seal may be bifurcated at a distal end; the bulb-shaped seal may include convex and concave portions at a distal end; and/or the bulb-shaped seal may include one or more protrusions at a distal end.

In another feature of this aspect, the base portion and the seal portion of the edge seal may be co-extruded.

In other features of this aspect, at least one of the one or more channels of the base portion may include a plurality of panel retention fingers for gripping the edge of the barrier panel; and/or the panel retention fingers may extend from sides of the at least one channel at an inwardly-oriented angle.

Broadly defined, the present invention according to another aspect is a data processing equipment structure. The data processing equipment structure includes a plurality of vertical and horizontal frame components, which, together, define an equipment structure frame. The data processing equipment structure further includes a pair of modular thermal isolation barriers disposed relative to the equipment structure frame, each having a panel and an edge seal. The modular isolation barriers are deployed against each other such that the respective edge seals abut, and establish a seal with, each other, thereby defining a continuous wall structure of the equipment structure frame.

In a feature of this aspect, each edge seal may include a seal portion and a base portion with one or more channels.

In another feature of this aspect, the seal portion of each edge seal may include a bulb-shaped seal.

In other features of this aspect, the bulb-shaped seal of each edge seal may be bifurcated at a distal end; the bulb-shaped seal of each edge seal may include convex and concave portions at a distal end; and/or the bulb-shaped seal of each edge seal may include a plurality of protrusions at a distal end.

In another feature of this aspect, when the edge seals of the pair of modular thermal isolation barriers are deployed against each other, the bifurcated distal ends of the edge seals may abut and deflect each other, thereby sealing a gap between the pair of modular thermal isolation barriers.

In another feature of this aspect, when the edge seals of the pair of modular thermal isolation barriers are deployed against each other, the bifurcated distal end of one of the edge seals may envelop and nest around the bifurcated distal end of the other edge seal, thereby sealing a gap between the pair of modular thermal isolation barriers.

In another feature of this aspect, when the edge seals of the pair of modular thermal isolation barriers are deployed against each other, the convex and concave portions of the edge seals may abut and matingly fit against each other, thereby sealing a gap between the pair of modular thermal isolation barriers.

In another feature of this aspect, when the edge seals of the pair of modular thermal isolation barriers are deployed against each other, one of the plurality of protrusions of one of the edge seals may fit between a pair of adjacent protrusions of the other edge seal, thereby sealing a gap between the pair of modular thermal isolation barriers.

In another feature of this aspect, the base portion and the seal portion of each edge seal may be co-extruded.

In other features of this aspect, at least one of the one or more channels of the base portion of each edge seal may include a plurality of panel retention fingers for gripping the edge of the corresponding panel; and/or the panel retention fingers of each edge seal may extend from sides of the at least one channel at an inwardly-oriented angle.

Broadly defined, the present invention according to another aspect is a data processing equipment structure. The data processing equipment structure includes a plurality of vertical and horizontal frame components, which, together, define an equipment structure frame. The data processing equipment structure further includes a plurality of panels disposed relative to the equipment structure frame to define a periphery. At least one of the plurality of vertical and horizontal frame components is an extruded strut having a generally uniform cross-section. The extruded strut includes an outwardly-facing channel extending along each of a pair of opposing sides of the extruded strut, at least one of which includes a set of evenly-spaced ridges, extending along each of two sides of the channel, for accommodating a threaded fastener. The extruded strut further includes one or more ledges, each having a depth sufficient to accommodate the thickness of one of the plurality of panels.

In features of this aspect, the extruded strut may be a vertical frame component; the extruded strut may be a horizontal frame component; each of at least one of the vertical frame components and at least one of the horizontal frame components may be an extruded strut having identical dimensions with each other; and/or the outwardly-facing channels on each pair of opposing sides of the extruded strut may be aligned with each other.

Broadly defined, the present invention according to another aspect is a data processing equipment structure. The data processing equipment structure includes a plurality of vertical and horizontal frame components, which, together, define an equipment structure frame. The data processing equipment structure further includes a plurality of panels disposed relative to the equipment structure frame to define a periphery and at least one gusset connecting at least one of the vertical frame components with at least one of the horizontal frame components. The gusset includes a generally triangular body and a pair of mounting plates. Each mounting plate extends generally perpendicularly from one of the edges of the generally triangular body and each includes a mounting aperture and at least one positioning tab. Each mounting tab accommodates a fastener such that one of the pair of mounting plates is mounted to the at least one vertical frame component and the other of the pair of mounting plates is mounted to the horizontal frame component. The at least one positioning tab of one of the pair of mounting plates extends into a corresponding channel of the at least one vertical frame component and the at least one positioning tab of the other of the pair of mounting plates extends into a corresponding channel of the at least one horizontal frame component.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
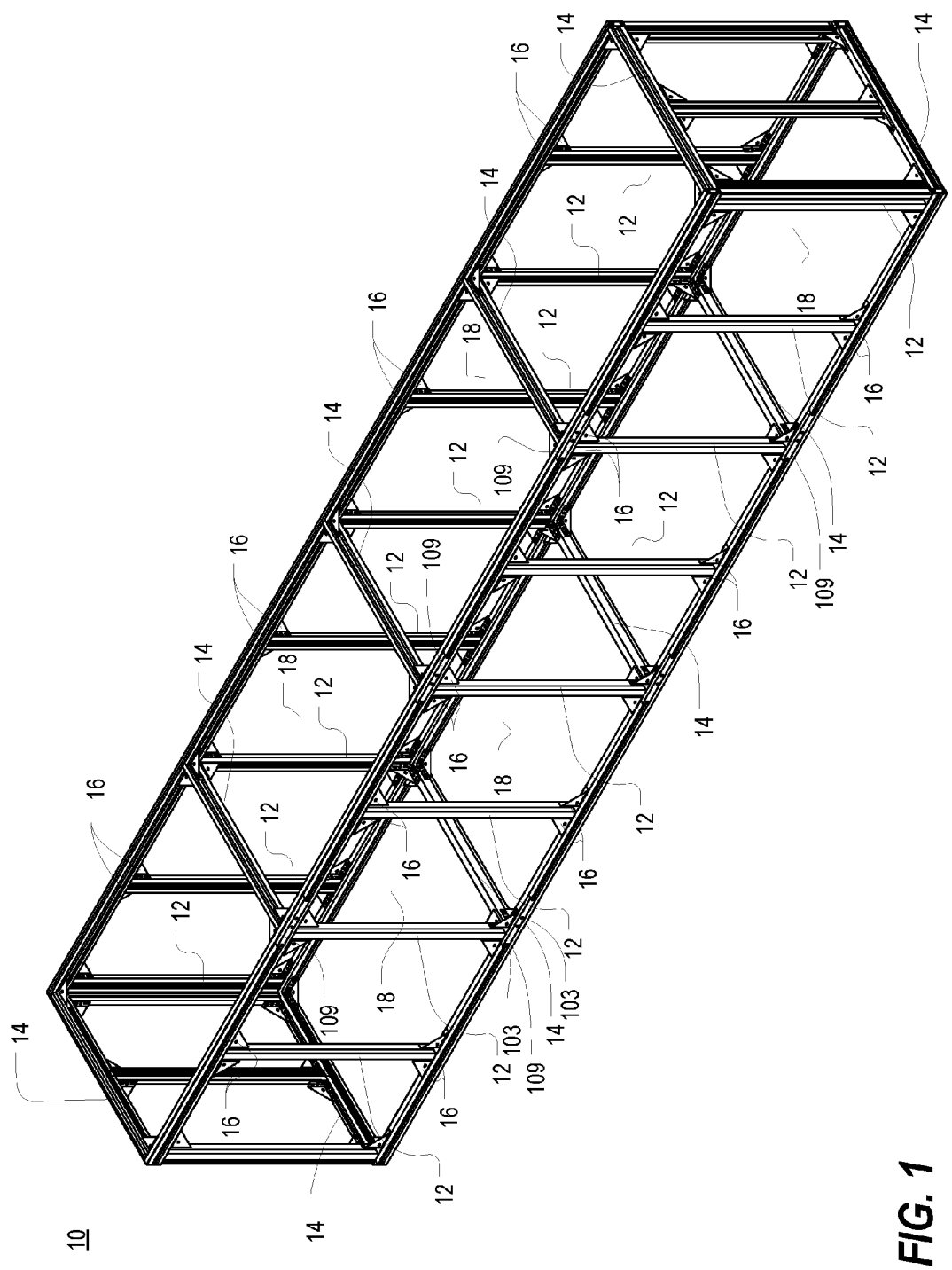
FIG. 1 is an isometric view of a data processing equipment structure for use with modular thermal isolation barriers to segregate heated air from cooled air in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

Figure 13:
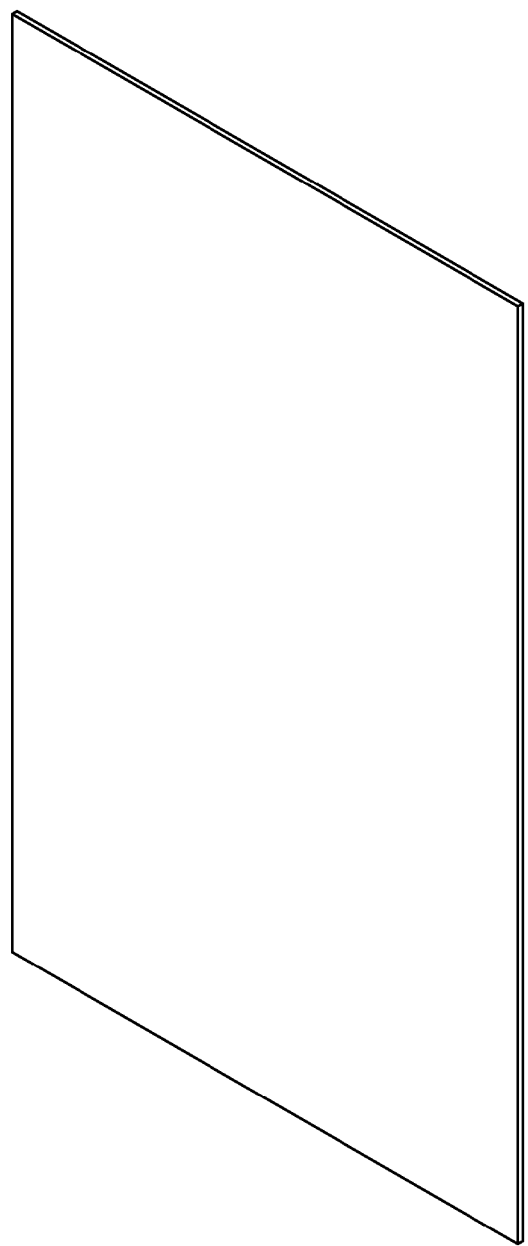
FIG. 13 is an isometric view of one of the panels of FIG. 1.

FIG. 1 is an isometric view of a data processing equipment structure 10 for use with modular thermal isolation barriers to segregate heated air from cooled air in accordance with one or more preferred embodiments of the present invention. As shown in FIG. 1, the data processing equipment structure 10 includes vertical struts 12, horizontal struts 14, and panels 18. The vertical and horizontal struts 12,14 are arranged into a framework formed from a plurality of interconnected rectangular frames. Some of the rectangular frames are oriented vertically to form the walls of the structure 10, while others of the frames are oriented horizontally to form the ceiling or floor of the structure 10. FIG. 13 is an isometric view of one of the panels 18 of FIG. 1. In at least some embodiments, the panels 18 are supported by these rectangular frames, particularly including the vertical wall frames and the horizontal ceiling frames. In some of these embodiments, each panel 18 is rectangular and is supported on each of its four sides by a vertical or horizontal strut 12,14.

As used herein, the term "data processing equipment" refers to a wide range of electronic equipment as well as racks, frames, enclosures, and the like that are typically used to house such equipment. Structures such as the structure 10 of FIG. 1 house a wide variety of electronic equipment, including storage equipment, servers, switches and other like devices and equipment for data processing. The panels 18 tend to prevent heated air inside the structure 10 from escaping and mixing with cool air outside the structure 10 (or vice versa), or conversely to prevent heated air outside the structure 10 from entering the interior of the structure 10 and mixing with the cool air therein (or vice versa).

Figure 14:
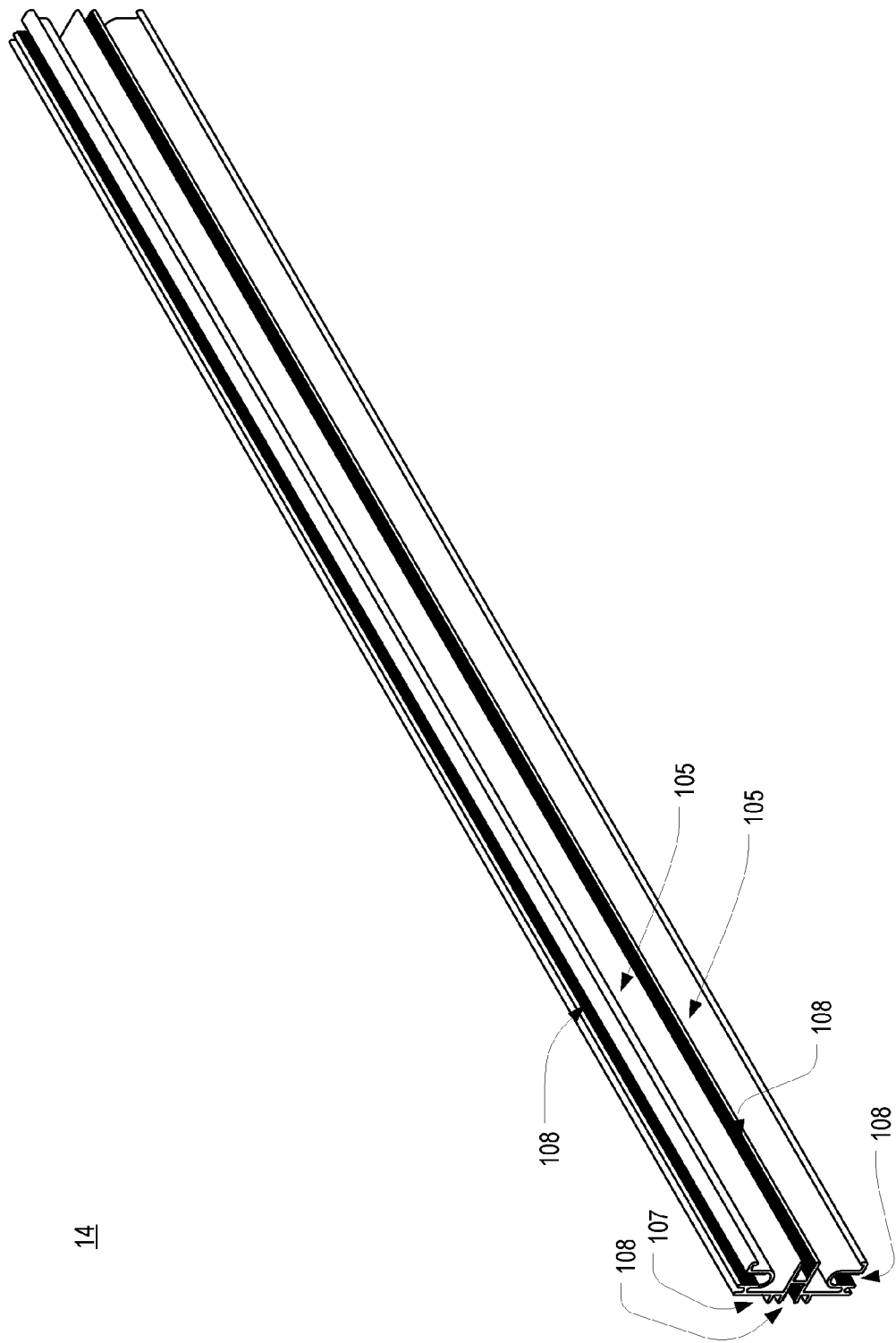
FIG. 14 is an isometric view of one of the horizontal struts of the data processing equipment structure of FIG. 1.

Although in at least some embodiments, data processing equipment structures other than that of FIG. 1 may be utilized, the structure 10 of FIG. 1 has several features, aspects, and other innovations of its own. In the data processing equipment structure 10 of FIG. 1, the vertical and horizontal struts 12,14 are each of extruded construction and may utilize an identical cross-section. In this regard, FIG. 14 is an isometric view of one of the horizontal struts 14 of the data processing equipment structure 10 of FIG. 1. In fact, the vertical and horizontal struts 12,14 may also, in some embodiments, be of identical lengths, and thus may be identical to each other. Thus, in such embodiments, the horizontal strut 14 of FIG. 14 may also be utilized as a vertical strut 12.

Figure 15:
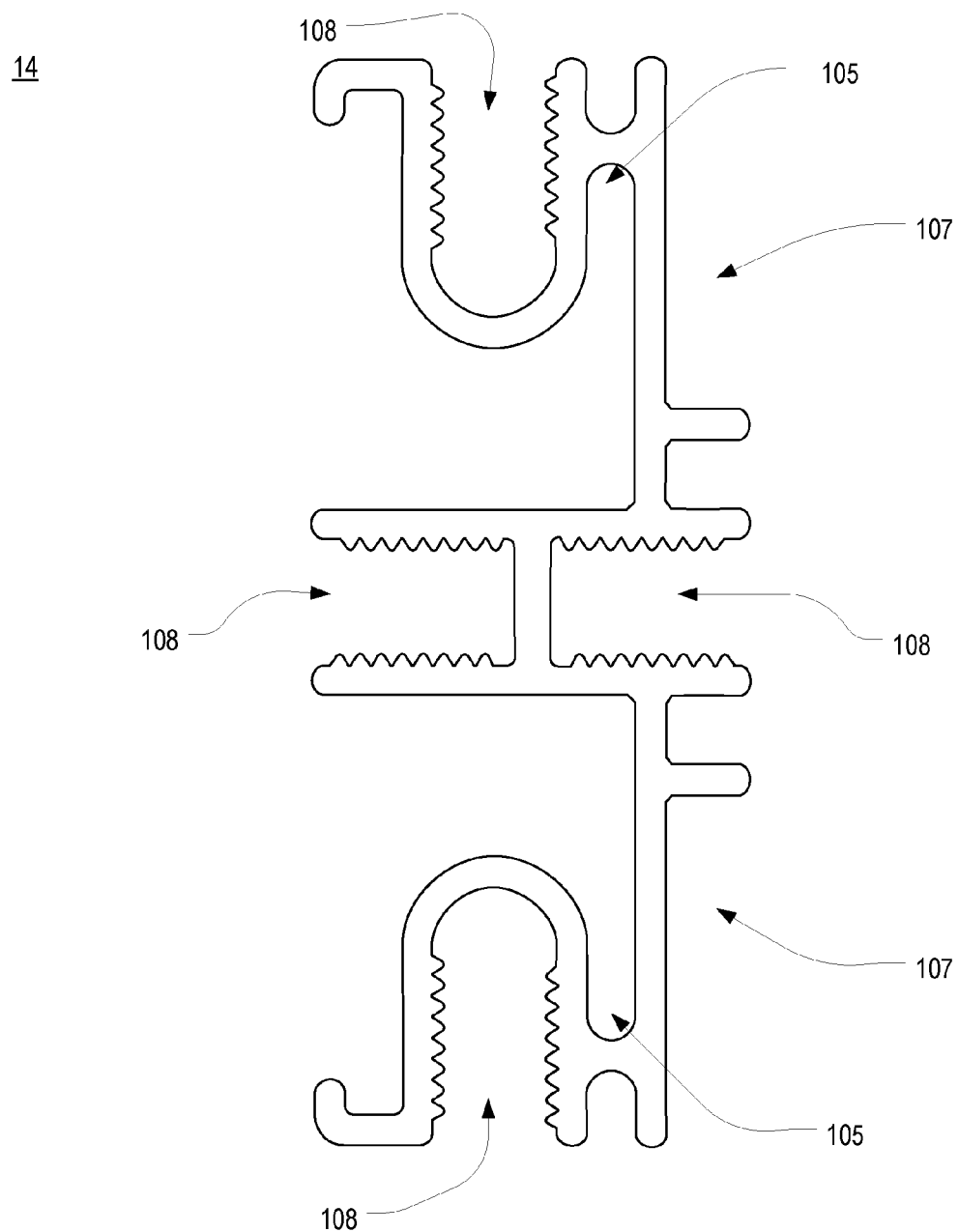
FIG. 15 is an end view of the strut of FIG. 14, illustrating the cross-section thereof.

FIG. 15 is an end view of the strut 14 of FIG. 14, illustrating the cross-section thereof. As shown therein, the strut 14 includes an outwardly-facing channel 108 running along each of its four sides. In at least some embodiments, including the one illustrated, the channels 108 on each pair of opposing sides are aligned with each other, but in some embodiments the channels are not aligned with each other. In at least some embodiments, the channels 108 are all of the same width and construction. Viewed in cross-section, each channel 108 includes a base and two sides, and a set of evenly-spaced ridges extends along each of the two sides. In at least some embodiments, the ridges on one side of the channel 108 are offset from the ridges on the opposite side of the channel 108. More particularly, in at least some embodiments, the ridges on one side of the channel 108 are offset from the ridges on the opposite side of the channel 108 by a distance equal to approximately one-half the width of one of the ridges. Such ridges are believed to be particularly useful in receiving and retaining a threaded fastener 103 inserted perpendicularly into the channel 108 when the fastener 103 utilizes threads whose depth and spacing is similar to the depth and spacing of the ridges in the channel 108.

Figure 16:
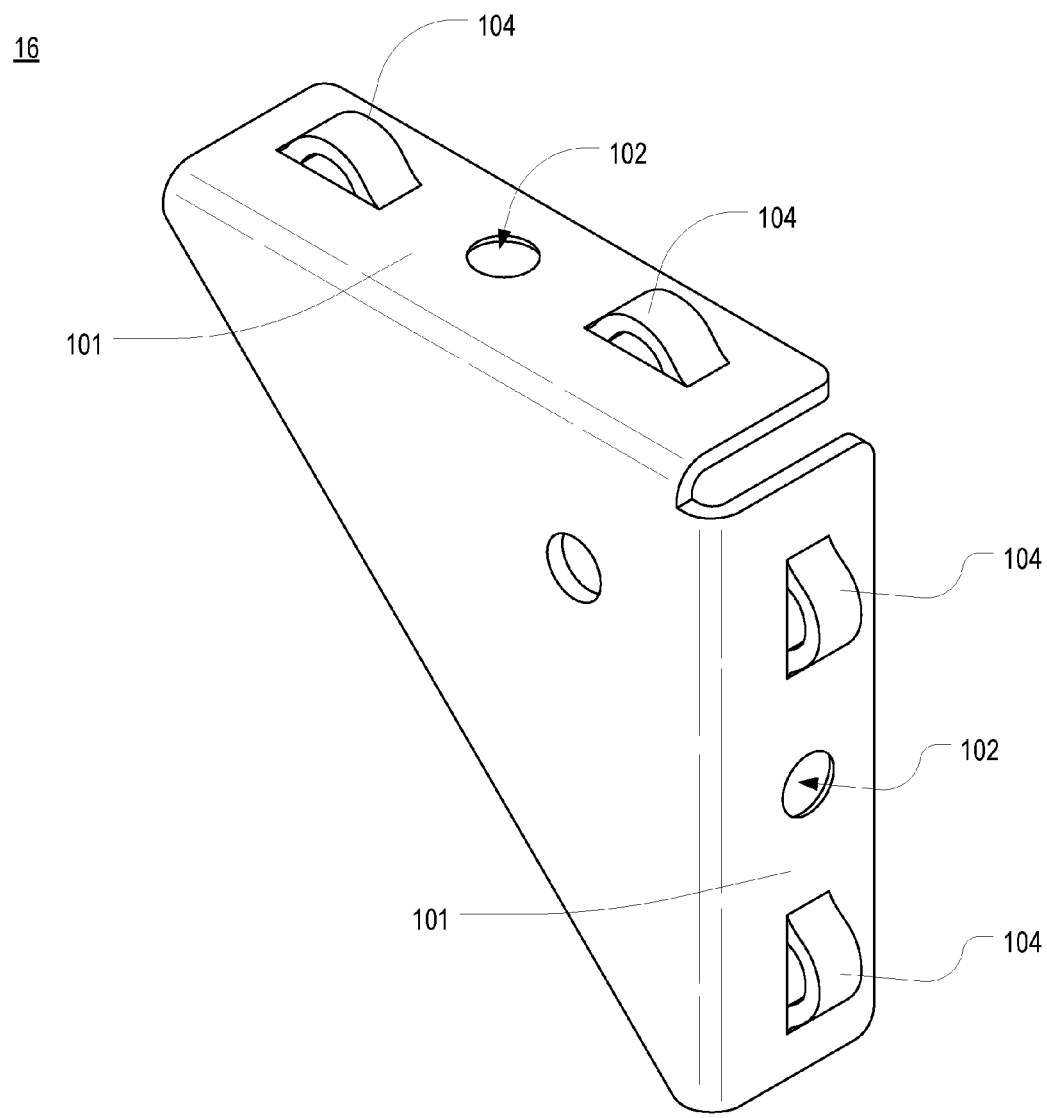
FIG. 16 is an isometric view of one of the gussets of FIG. 1.
Figure 17:
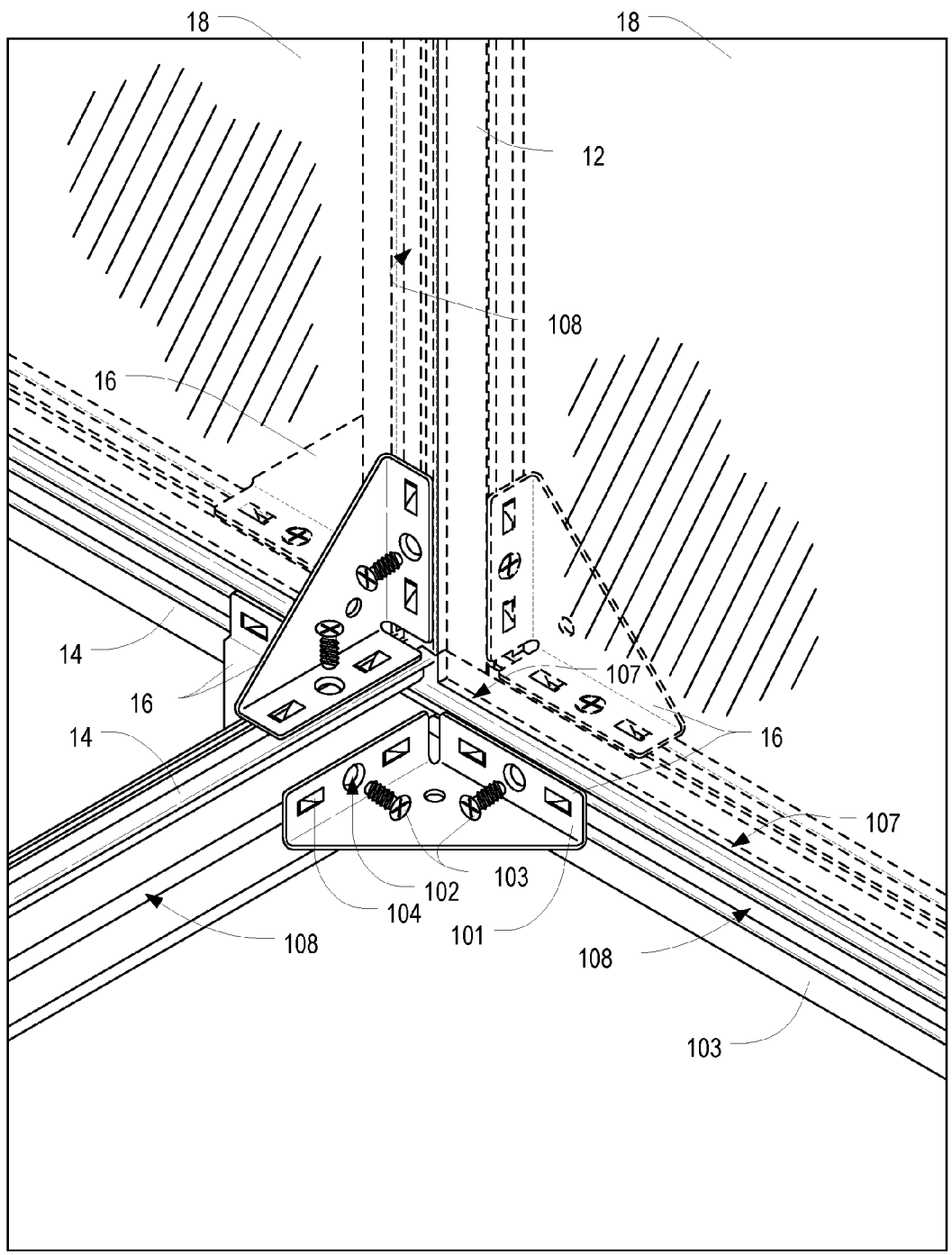
FIG. 17 is an enlarged, partially exploded, fragmentary view of one of the joints of the structure of FIG. 1.

In at least some embodiments, the struts 12,14 may be connected together using gussets 16. In this regard, FIG. 16 is an isometric view of one of the gussets 16 of FIG. 1. As shown therein, the gusset 16 is triangular and includes two mounting plates 101, each of which includes a mounting aperture 102 and a pair of positioning tabs or other protrusions 104. The diameter of the mounting aperture 102 is preferably selected to match the width of at least one of the channels 108 in the struts 12,14, and the width of the positioning tabs 104 is selected to fit relatively snugly within the same channel 108. Thus, the gusset 16 may be connected to a strut 12,14 by inserting the positioning tabs 104 of one mounting plate 101 into one of the channels 108 in the strut 12,14, inserting a fastener 103 (shown in FIG. 17) through the mounting aperture 102 and into the same channel 108, and screwing (rotating) the fastener 103 into the ridges until the gusset 16 is tight against the strut 12,14. The gusset 16 may be connected to a second strut 12,14 that is perpendicular to the first strut 12,14 by repeating the process using the tabs 104 and aperture 102 of the other mounting plate 101. In this way, two intersecting (perpendicular) struts may be connected together. More complicated joints or intersections in a data processing equipment structure 10 may be assembled using multiple gussets 16. In any particular strut 12,14, one, two, three, or all four of the channels 108 may be utilized. In this regard, FIG. 17 is an enlarged, partially exploded, fragmentary view of one of the joints of the structure 10 of FIG. 1. As shown therein, five gussets 16 have been utilized to connect three horizontal struts 14 and one vertical strut 12 together in the manner described above.

Referring again to FIG. 15, the strut 14 further includes one or more ledges 107. Each ledge 107 has a depth suitable for receiving one of the panels 18. The panels 18 may be mounted on or with these ledges 107 as shown in FIG. 17. Notably, in FIG. 17, the panels 18 are shown as being transparent, with objects behind them shown in broken lines.

Figure 18:
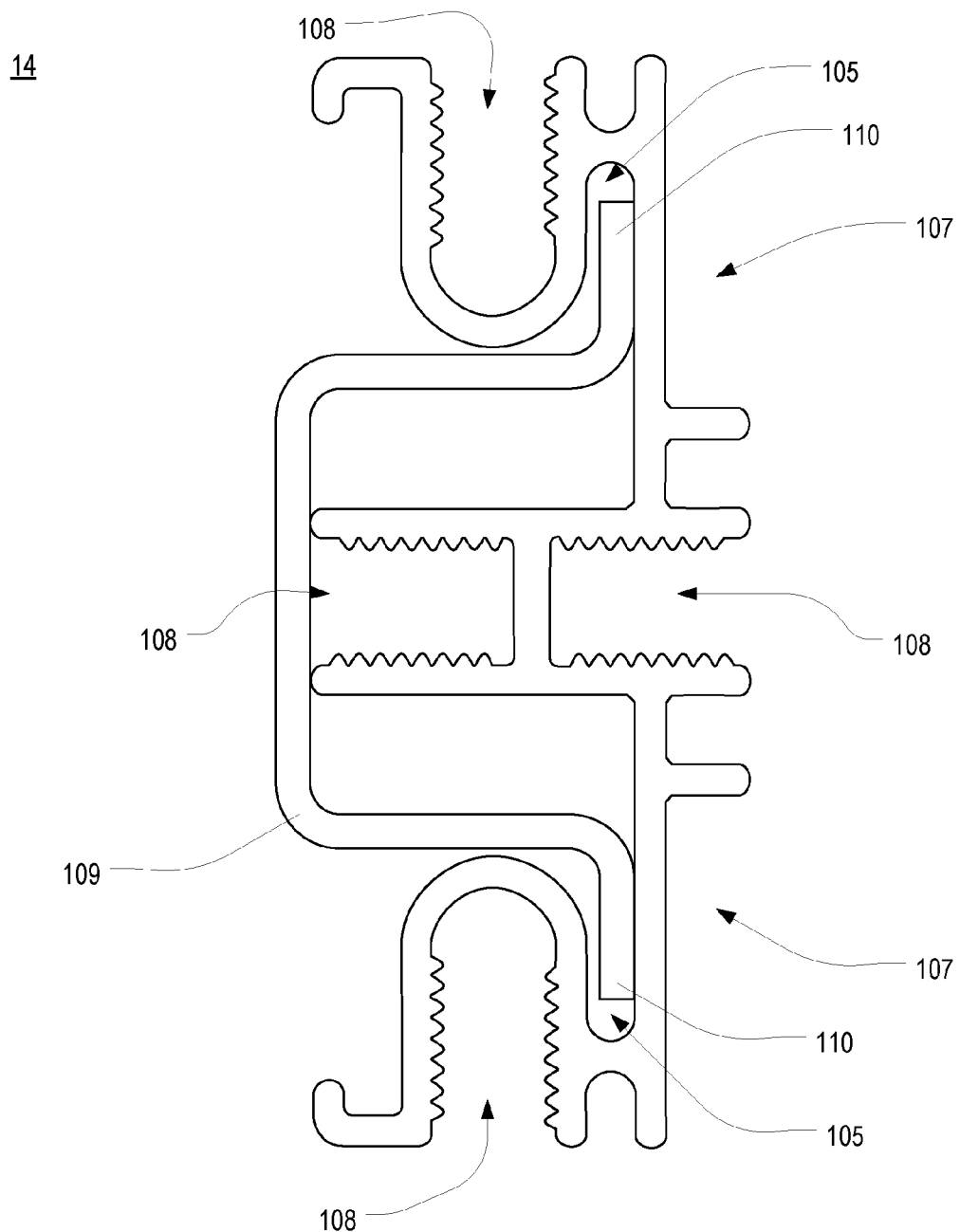
FIG. 18 is an end view of the strut of FIG. 15, illustrating a splice bracket installed therein.

Referring again to FIG. 15, the strut 14 further includes additional channels or slots 105 for receiving a splice bracket 109. In this regard, FIG. 18 is an end view of the strut 14 of FIG. 15, illustrating a splice bracket 109 installed therein. A splice bracket 109 may be used to attach two struts 14 end-to-end, as shown in FIG. 1. The splice bracket 109 includes two ear flanges 110 that are sized and proportioned to fit within the channels or slots 105 on each strut 14. By inserting one end of the splice bracket 109 in the end of a first strut 14 and the other end of the splice bracket 109 in the end of a second strut 14, the two struts 14 may be coupled together. The arrangement may be fixed in place by inserting threaded fasteners 103 through apertures in the splice bracket 109 and screwing (rotating) the fasteners 103 into a ridged channel 108 in the struts 14 until the splice bracket 109 is tight against the struts 14. Several such arrangements are shown in FIG. 1.

Figure 2:
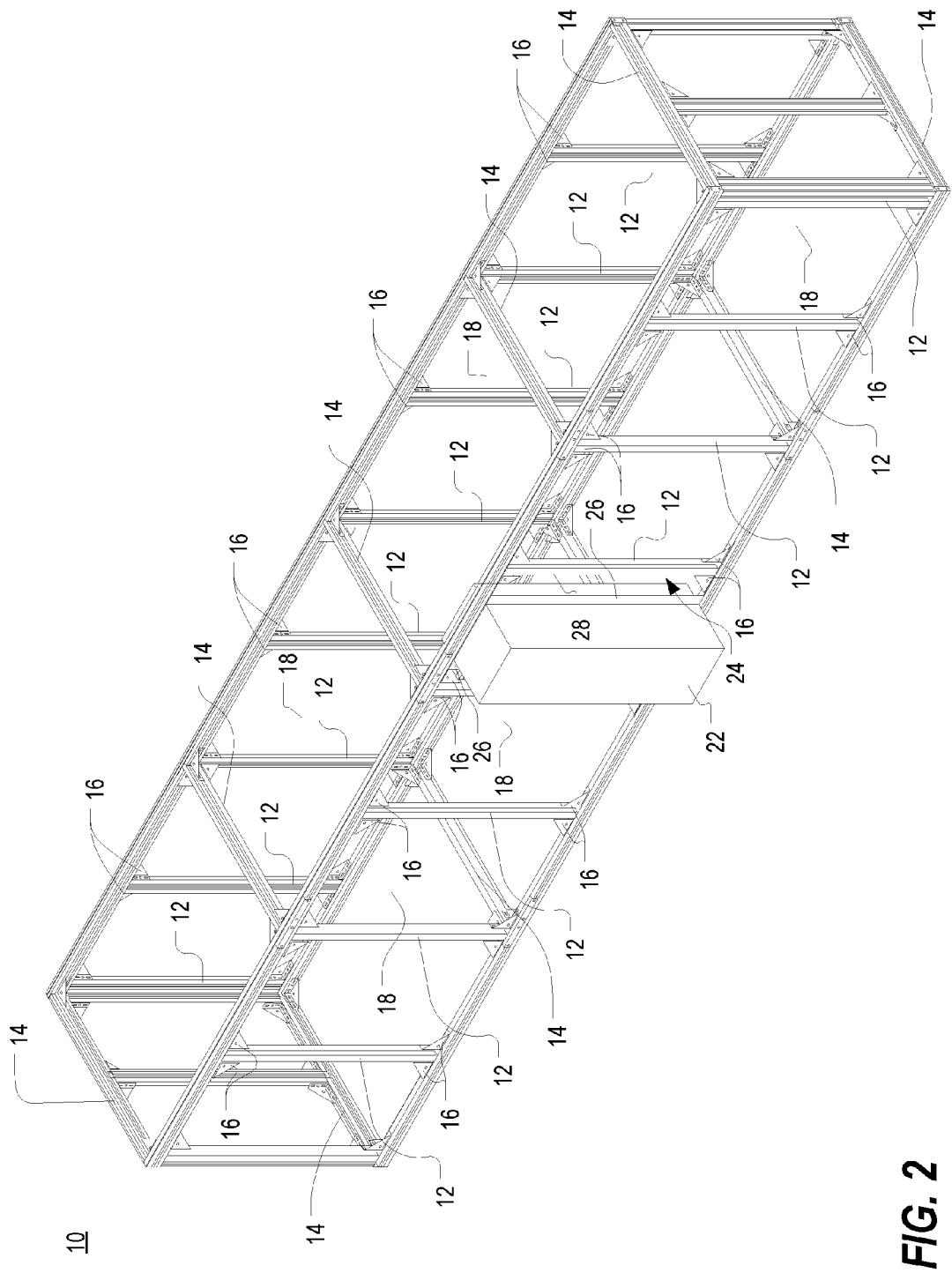
FIG. 2 is an isometric view of the data processing equipment structure of FIG. 1, illustrating the use of two modular thermal isolation barriers to accommodate an awkwardly located equipment enclosure.

Although in practice, many data processing equipment structures may be constructed in convenient shapes with no unusual obstacles or other incongruous geometry problems, such situations do occur. For example, FIG. 2 is an isometric view of the data processing equipment structure 10 of FIG. 1, illustrating the use of two modular thermal isolation barriers 24 to accommodate an awkwardly located equipment enclosure 22. In particular, the enclosure extends through a wall of the structure 10, with portions of the enclosure 22 being located both inside and outside the periphery of the structure 10. Although from a design perspective, it would be preferable to avoid such a situation, the modular thermal isolation barriers 24 make it possible to accommodate the unusual geometry and to maintain the heated air/cooled air segregation of the data processing equipment structure 10.

Figure 3:
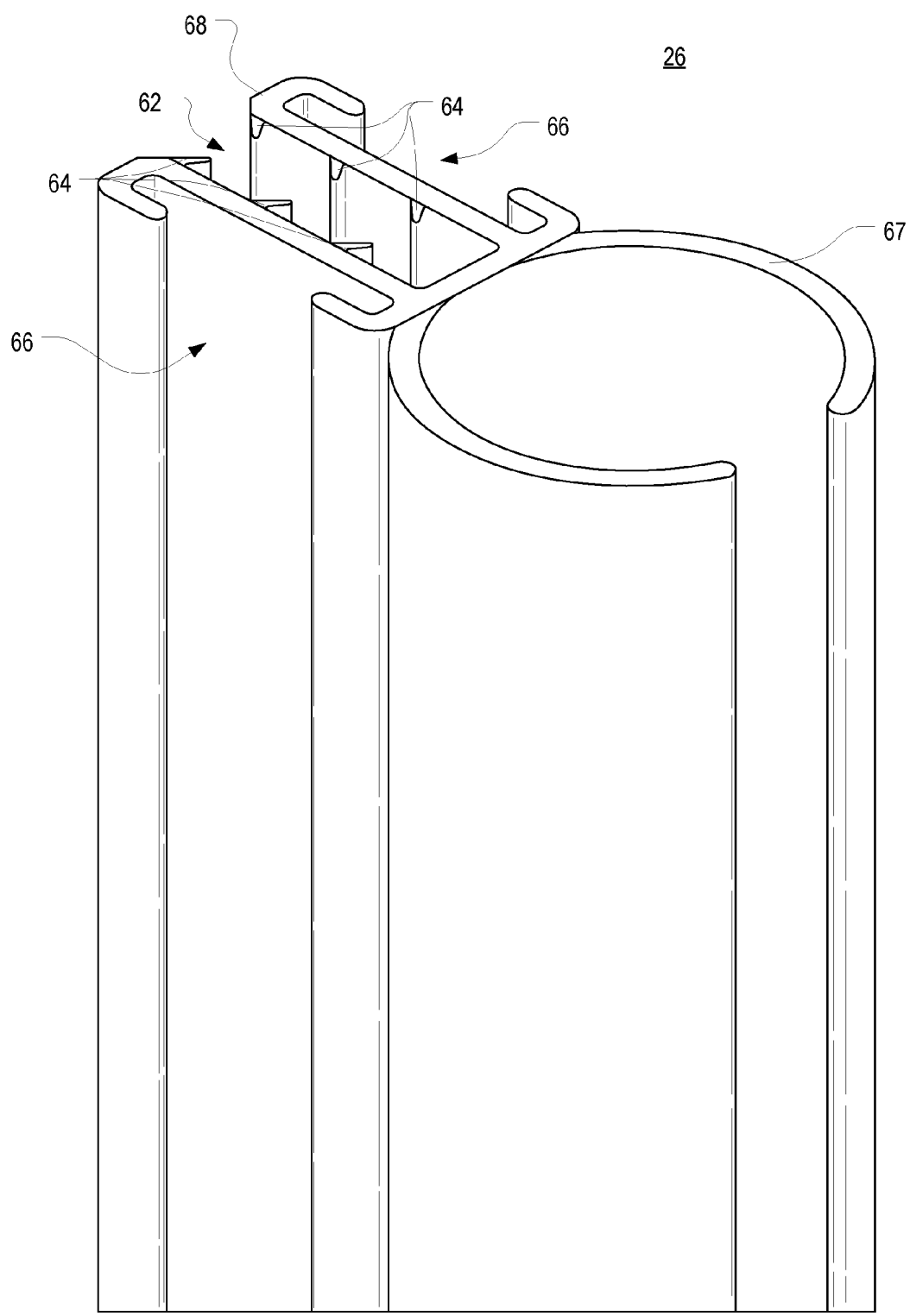
FIG. 3 is a fragmentary isometric view of an upper end of the edge seal of one of the modular thermal isolation barriers of FIG. 2.
Figure 4:
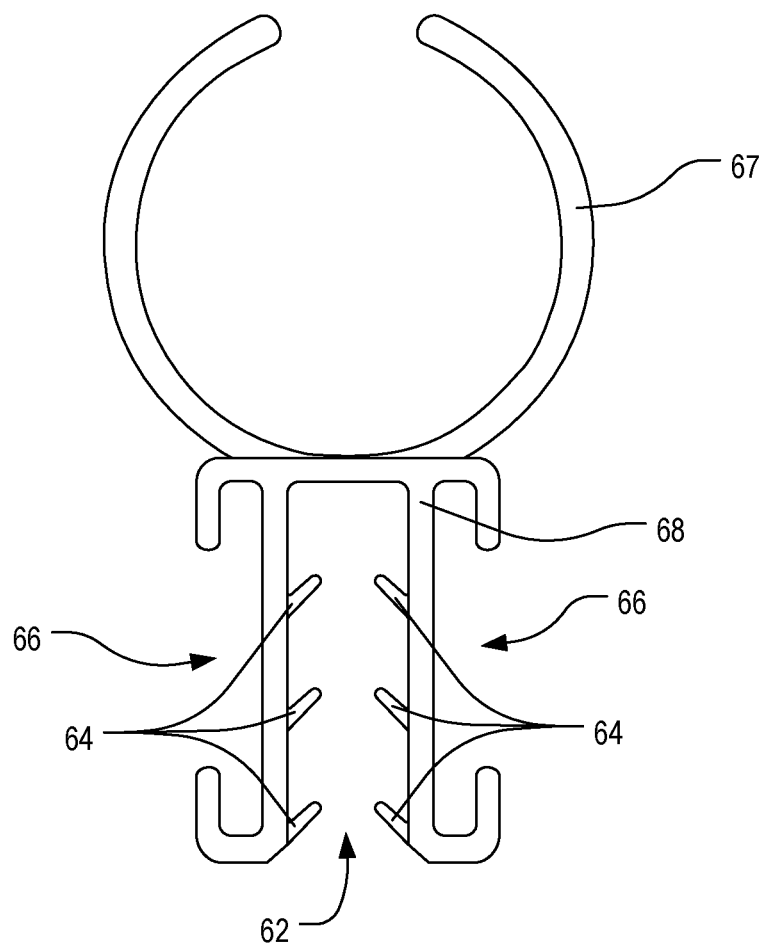
FIG. 4 is a top or top cross-sectional view of the edge seal of FIG. 3.

Each modular thermal isolation barrier 24 includes a panel 28 and at least one edge seal 26. FIG. 3 is a fragmentary isometric view of an upper end of the edge seal 26 of one of the modular thermal isolation barriers 24 of FIG. 2, and FIG. 4 is a top or top cross-sectional view of the edge seal 26 of FIG. 3. As shown therein, the edge seal 26 is an extruded member having a generally uniform cross-section along its length. In at least some embodiments, it is manufactured from material which may be cut relatively easily to make pieces of different lengths.

As perhaps best shown in FIG. 4, the cross-section of the edge seal 26 includes a multi-channel base portion 68, a "bulb"-type seal portion 67, and a plurality of panel retention fingers 64 within one of the channels 62 on the base portion 68. In at least some embodiments, the bulb seal portion 67 is bifurcated at a distal end, resulting in a "C" shape, but for a purpose described hereinbelow, in other embodiments, the bulb seal may be a fully closed structure (i.e., an "O" shape). Other geometries are likewise possible. In some embodiments, the bulb seal portion 67 and the multi-channel base portion 68 are manufactured from the same material in a single extrusion process. In other embodiments, the bulb seal portion 67 and the multi-channel base portion 68 are manufactured from different materials in a co-extrusion process. In still other embodiments, bulb seal portion 67 and the multi-channel base portion 68 are manufactured from different materials in separate extrusion processes, and then are attached together. Likewise, the panel retention fingers 64 may be made of the same material as the base portion 68, or of a different material. In some of the latter embodiments, the retention fingers 64, base portion 68, and bulb seal portion 67 are all made of different materials. In some embodiments, the base portion 68 is made from ABS or PVC plastic (or some other rigid plastic), the retention fingers 64 are made from flexible rubber such as flexible alcryn, and the bulb seal portion 67 is made of a material similar to that of the flexible fingers 64, or from a softer rubber or foam rubber. The base portion 68 could also be made out of at least some metals, such as aluminum.

As perhaps best understood from FIG. 4, the base portion 68 includes a plurality of channels 62,66. In particular, an end channel 62 is sized to receive a panel 28, and two side channels 66 are provided for coupling to a rigid support structure (described hereinbelow). The retention fingers 64 extend at an inwardly-oriented angle from sides of the end channel 62 to help retain an edge of the panel 28, as described below.

Figure 5:
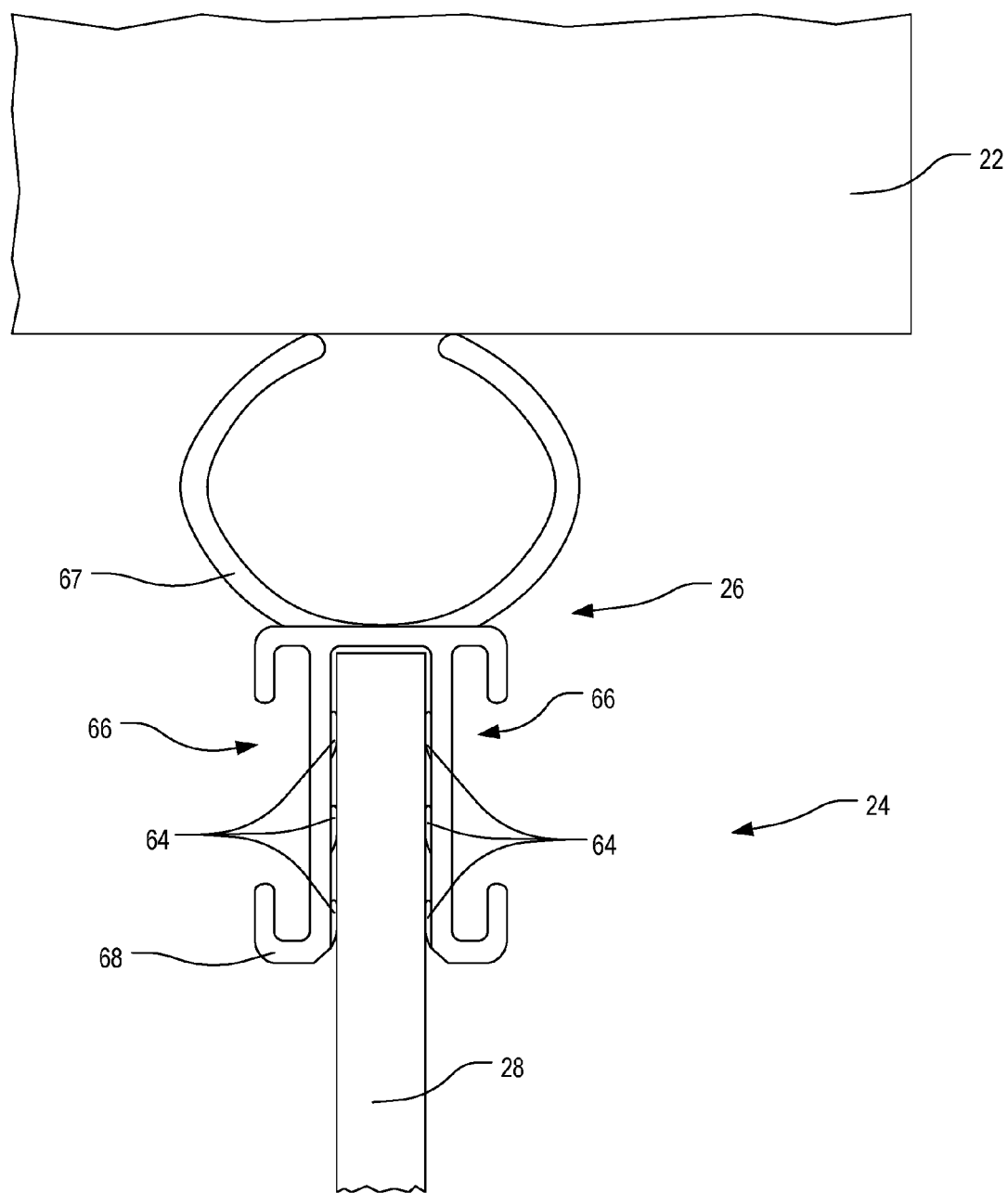
FIG. 5 is a fragmentary top or top cross-sectional view of a modular thermal isolation barrier, using the edge seal of FIG. 4, shown deployed against the right side of the equipment enclosure of FIG. 2.

FIG. 5 is a fragmentary top or top cross-sectional view of a modular thermal isolation barrier 24, using the edge seal 26 of FIG. 4, shown deployed against the right side of the equipment enclosure 22 of FIG. 2. As shown therein, the panel 28 is inserted into the end channel 62. This insertion is opposed by the retention fingers 64, but the fingers 64 flex enough, in the direction of insertion, to accommodate the edge of the panel 28. However, once the panel 28 is fully seated within the channel 62, the same retention fingers 64 tend to prevent the panel 28 from being removed. This is accomplished by the compression that is introduced by the panel 28 against the fingers 64, and the angled direction of the fingers 64.

When the modular thermal isolation barrier 24 is deployed as shown in FIG. 5, the panel 28 blocks most of the air that could otherwise pass by the side of the equipment enclosure 22 and either into or out of the interior of the data processing equipment structure 10. The gap between the edge of the panel 28 and the side of the enclosure 22 is filled and sealed by the edge seal 26, the bulb seal portion 67 of which is compressed against the enclosure 22.

Notably, the use of the modular thermal isolation barriers 24, as shown in FIG. 2, allows the original panel 18 to be omitted and the resulting gap filled with smaller panels 28. Such a solution is not possible with the original panels 18 by themselves because they are not typically sized to fit non-standard openings. In addition, they are not typically mountable in non-standard locations. The modular thermal isolation barrier 24 thus offers considerable convenience and flexibility to the installer or designer.

Figure 6:
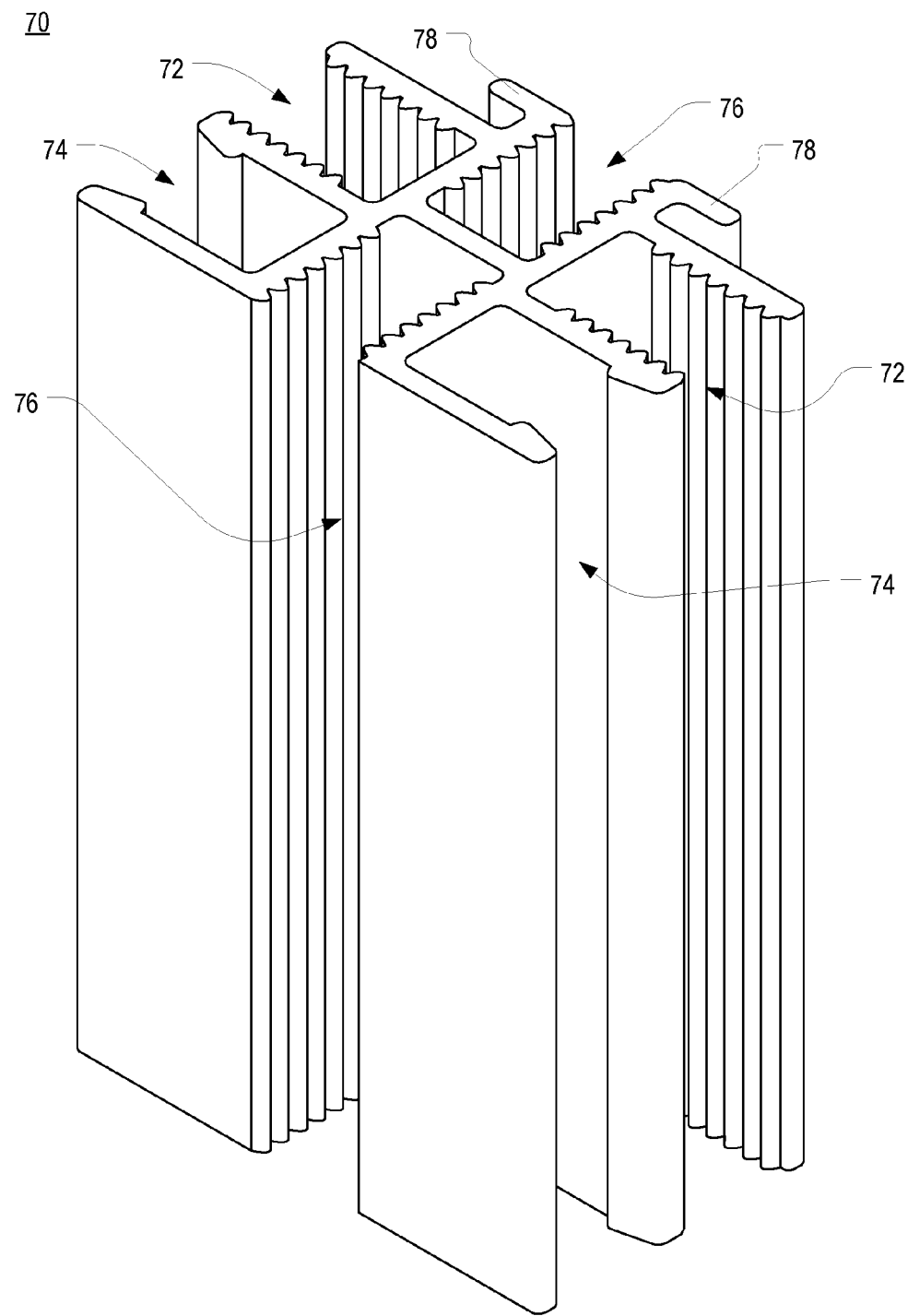
FIG. 6 is a fragmentary isometric view of an upper end of a rigid support structure adapted to be coupled to the edge seal of FIG. 3.
Figure 7:
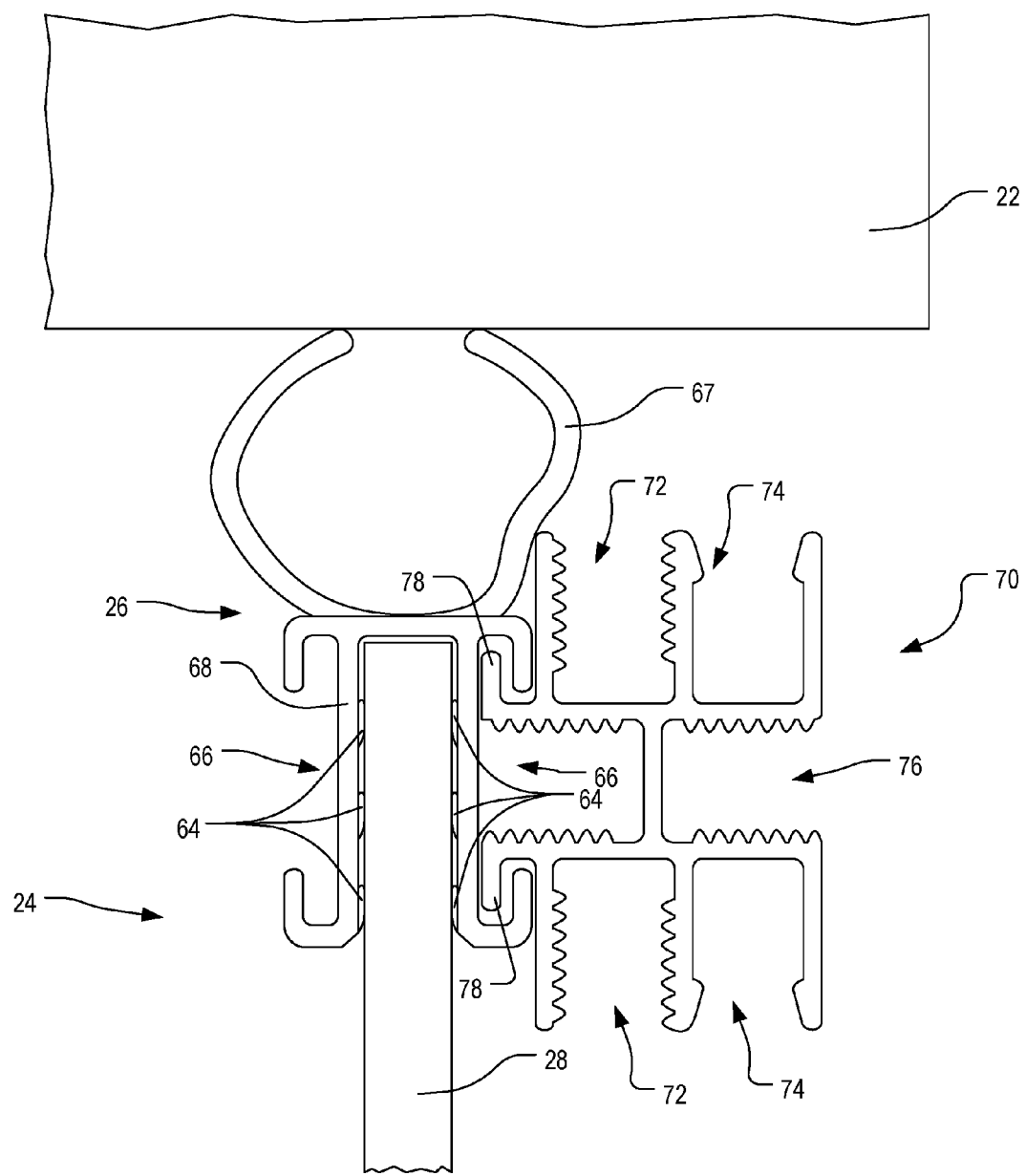
FIG. 7 is a fragmentary top or top cross-sectional view of a modular thermal isolation barrier, using the edge seal of FIG. 4 coupled to the rigid support structure of FIG. 6, shown deployed against the right side of the equipment enclosure of FIG. 2.

In the latter regard, it is often desirable to provide additional support to the modular thermal isolation barriers 24, either as primary support or as secondary support to maintain them in place. FIG. 6 is a fragmentary isometric view of an upper end of a rigid support structure 70 adapted to be coupled to the edge seal 26 of FIG. 3, and FIG. 7 is a fragmentary top or top cross-sectional view of a modular thermal isolation barrier 24, using the edge seal 26 of FIG. 4 coupled to the rigid support structure 70 of FIG. 6, shown deployed against the right side of the equipment enclosure 22 of FIG. 2. Like the edge seal 26, the rigid support structure 70 may also be an extruded member having a generally uniform cross-section along its length. In at least some embodiments, it is manufactured from material which may be cut relatively easily to make pieces of different lengths. In one contemplated embodiment, the rigid support structure 70 is made out of aluminum. In another contemplated embodiment, the rigid support structure 70 is made out of a plastic material.

The rigid support structure 70 includes six channels 72,74,76 and a pair of opposed retention flanges 78 for coupling the structure 70 to the edge seal 26, as shown in FIG. 7. The channels include a pair of opposed ridged channels 76 in the sides of the structure 70, a pair of opposed ridged channels 72 in the ends of the structure 70, and a pair of opposed supplemental channels 74 in the ends of the structure 70, adjacent the ridged channels 72. Each of the ridged channels 72,76 is adapted to receive a threaded fastener (not shown) inserted into it, and because the channels 72,76 extend the length of the structure 70, fasteners may be utilized at an infinite number of locations along such length.

The rigid support structure 70 may itself be attached to other support members of the data processing equipment structure 10, such as the vertical struts 12 and horizontal struts 14. Alternatively or additionally, a data processing equipment structure 10 may be assembled using multiple rigid support structures 70, alone or in combination with the vertical struts 12 and horizontal struts 14. The edge seals 26 may be coupled to the rigid support structures 70, and thus the panels 28 may be supported.

Figure 8:
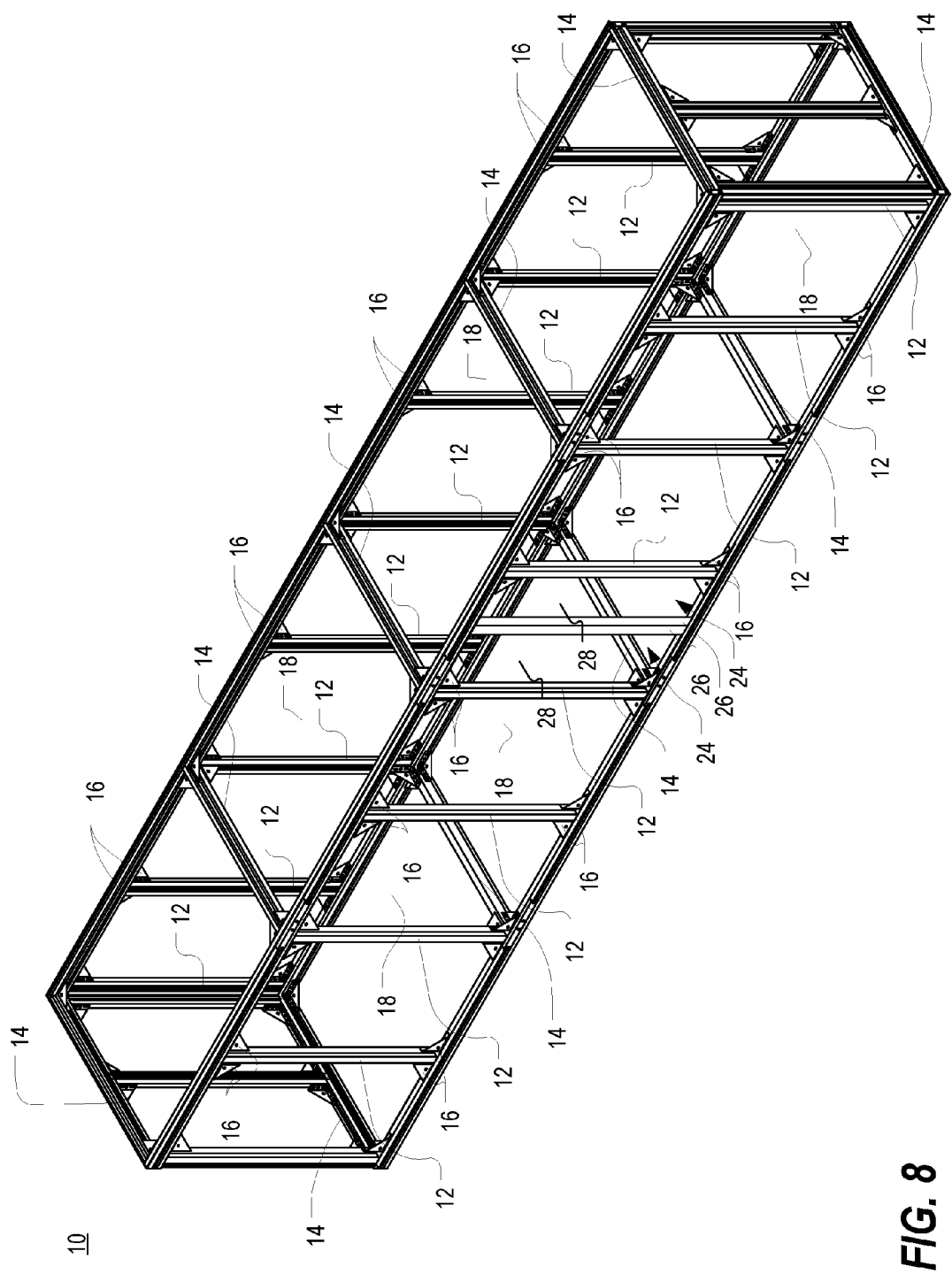
FIG. 8 is an isometric view of the data processing equipment structure of FIG. 1, illustrating the use of two modular thermal isolation barriers abutting each other to create a continuous wall structure.
Figure 9:
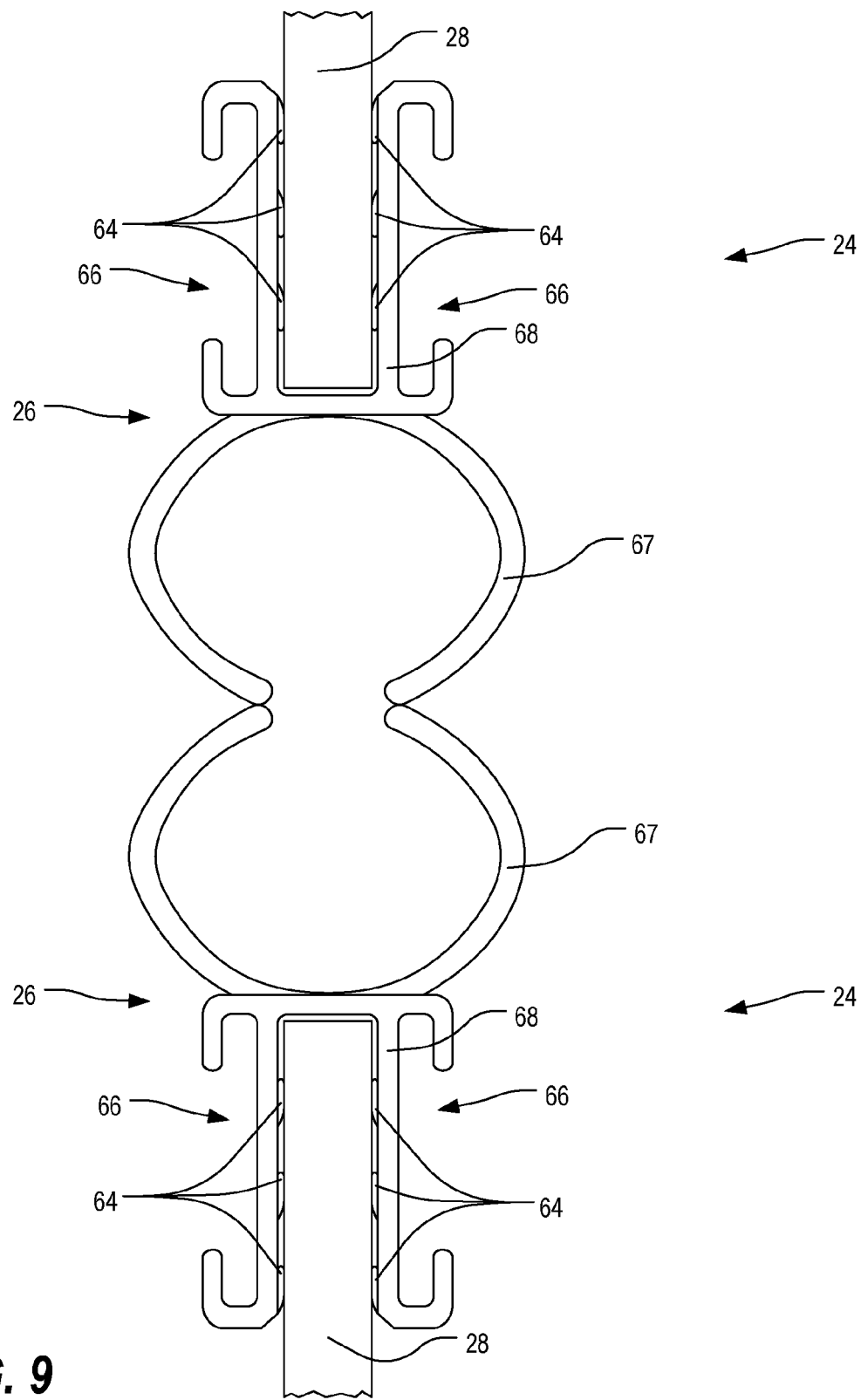
FIG. 9 is a fragmentary top or top cross-sectional view of two modular thermal isolation barriers, each using the edge seal of FIG. 4, shown deployed against each other in the manner shown in FIG. 8.

In this regard, the modular thermal isolation barriers 24 may be utilized in other ways as well. FIG. 8 is an isometric view of the data processing equipment structure 10 of FIG. 1, illustrating the use of two modular thermal isolation barriers 24 abutting each other to create a continuous wall structure. FIG. 9 is a fragmentary top or top cross-sectional view of two modular thermal isolation barriers 24, each using the edge seal 26 of FIG. 4, shown deployed against each other in the manner shown in FIG. 8. As shown therein, each barrier 24 includes a panel 28 and an edge seal 26, with the respective edge seals 26 abutting each other in opposed fashion, so as to seal the gap between adjacent panels 28. In this manner, an entire wall may be created from modular thermal isolation barriers 24.

Figure 10:
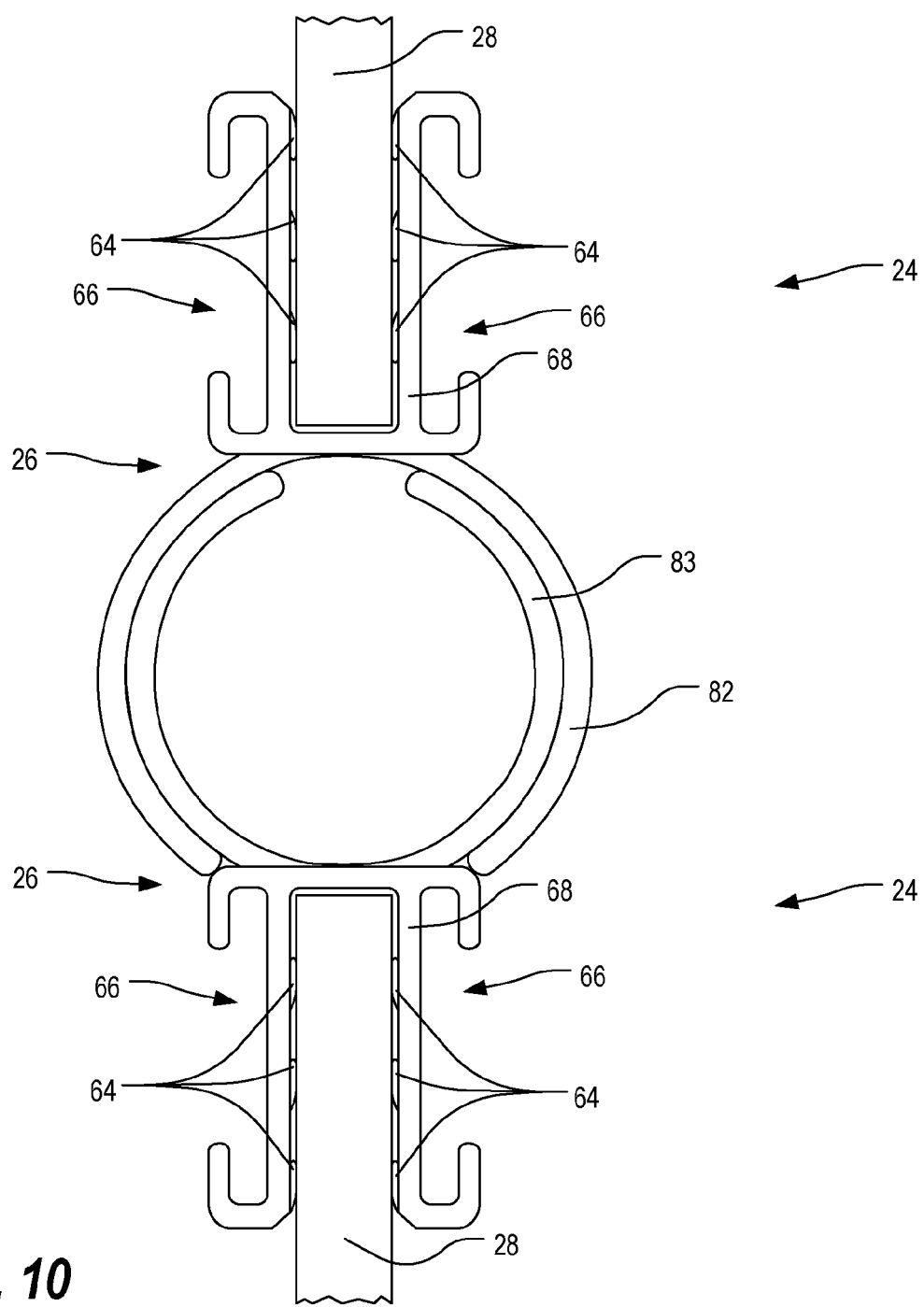
FIG. 10 is a fragmentary top or top cross-sectional view of two modular thermal isolation barriers, each using the edge seal of FIG. 4, shown deployed against each other in an alternative arrangement.

The edge seals 26 provide an additional sealing feature as well. In particular, FIG. 10 is a fragmentary top or top cross-sectional view of two modular thermal isolation barriers 24, each using the edge seal 26 of FIG. 4, shown deployed against each other in an alternative arrangement. As shown in FIG. 10, the bulb seal portion 83 of one edge seal 26 has been inserted through the bifurcated opening of the bulb seal portion 82 of the other edge seal 26. The outer bulb seal portion 82 may be forced open wider than normal, and the inner bulb seal portion 83 may be compressed somewhat, but the flexible nature of the bulb seal portions 82,83 facilitates this. The resulting "nested" arrangement eliminates nearly all air gaps between adjacent panels 28 and effectively fastens the edge seals 26 together.

Figure 11:
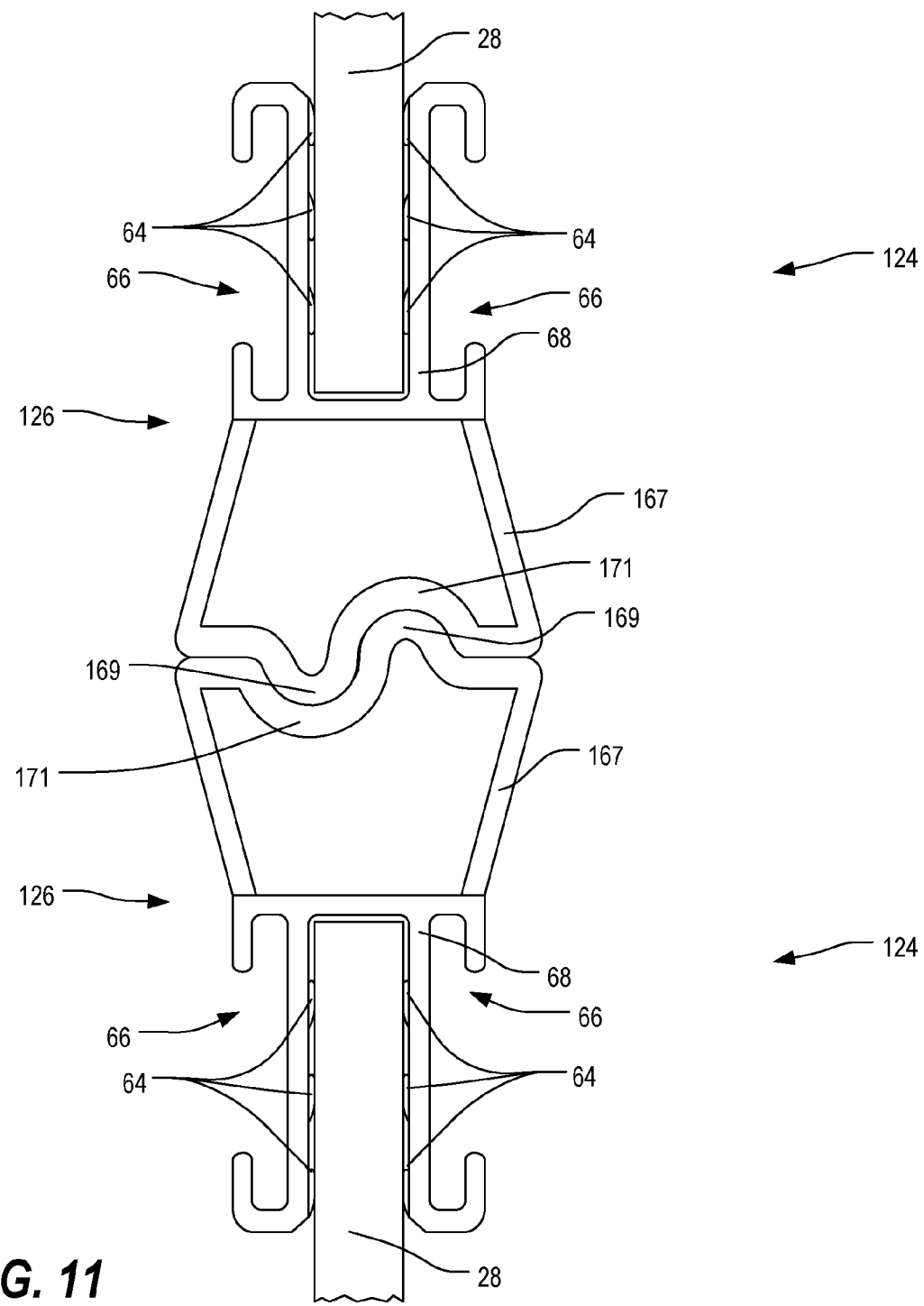
FIG. 11 is a fragmentary top or cross-sectional view of two alternative modular thermal isolation barriers, each using an alternative edge seal, shown deployed against each other.

In at least some embodiments of the present invention, other edge seal geometries are also possible. In this regard, FIG. 11 is a fragmentary top or cross-sectional view of two alternative modular thermal isolation barriers 124, each using an alternative edge seal 126, shown deployed against each other. Each edge seal 126 includes a shaped seal portion 167, the geometry of which facilitates the edge seals 126 being deployed against each other in such a way that the gap between adjacent panels is effectively sealed. Each shaped seal portion 167 of the edge seals 126 includes convex and concave portions 169,171 that can be matingly paired against one another to seal the gap between adjacent panels.

Figure 12:
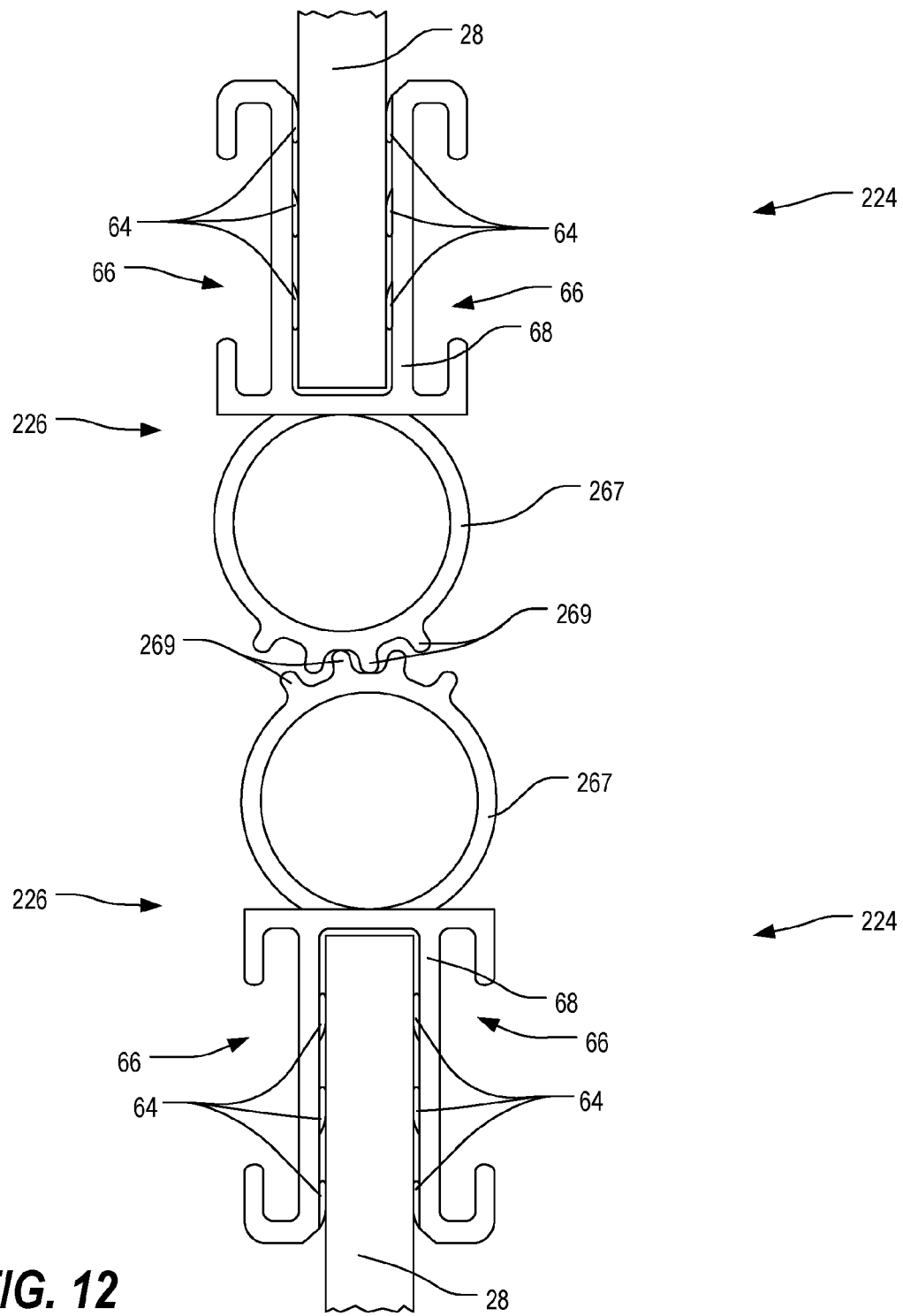
FIG. 12 is a fragmentary top or cross-sectional view of two alternative modular thermal isolation barriers, each using another alternative edge seal, shown deployed against each other.

Similarly, FIG. 12 is a fragmentary top or cross-sectional view of two alternative modular thermal isolation barriers 224, each using another alternative edge seal 226, shown deployed against each other. Each edge seal 226 includes a shaped seal portion 267, the geometry of which facilitates the edge seals 226 being deployed against each other in such a way that the gap between adjacent panels is effectively sealed. Each shaped seal portion 267 of the edge seals 226 includes a plurality of protrusions 269. When deployed against each other, a protrusion 269 on one of the edge seals 226 is positionable between two protrusions 269 on the other edge seal 226, thereby sealing the gap between adjacent panels.

Among other advantages, the present invention provides a barrier against thermal communication between separate air spaces. The invention allows the user to build a structure that may seal one or more walls/planes of an air space around uneven geometry and objects that are placed in between the sealing plane/s. The invention also allows the user to quickly alter the shape of the sealing plane to seal around additional openings or obstructions with minimal disassembly. This structure also has the ability to add stiffeners as needed for more structure and additional mounting points.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A data processing equipment structure comprising:
a frame structure that includes a rigid support structure; and
first and second modular thermal isolation barriers for use in sealing a periphery of the frame structure, each of the first and second modular thermal isolation barriers including:
an edge seal having a seal portion and a base portion, each comprised of a different material, the base portion including a panel-receiving end channel and at least one side channel; and
a panel, an edge of which is disposed within the panel-receiving end channel;
wherein the rigid support structure has a generally uniform cross-sectional shape along its length and is coupled to the edge seal of the first modular thermal isolation barrier at the at least one side channel, thereby providing structural support to the first modular thermal isolation barrier; and
wherein the seal portion of the first modular thermal isolation barrier engages the seal portion of the second modular thermal isolation barrier, thereby preventing the passage of air through a gap between the first and second modular thermal isolation barriers.

2. The data processing equipment structure of claim 1, wherein the rigid support structure includes a plurality of channels, extending along the length thereof, for coupling the rigid support structure to one or more other structures.

3. The data processing equipment structure of claim 2, wherein at least one of the plurality of channels of the rigid support structure is ridged to accommodate a threaded fastener.

4. The data processing equipment structure of claim 1, wherein the rigid support structure includes a pair of opposed retention flanges for coupling the rigid support structure to the edge seal.

5. The data processing equipment structure of claim 1, wherein the seal portions of the first and second modular thermal isolation barriers interlock with one another to prevent the passage of air through a gap between the first and second modular thermal isolation barriers.

6. The data processing equipment structure of claim 1, wherein the seal portion of each of the first and second modular thermal isolation barriers is bifurcated at a distal end.

7. The data processing equipment structure of claim 6, wherein the bifurcated distal ends of the seal portions deflect one another.

8. The data processing equipment structure of claim 6, wherein the bifurcated distal end of the seal portion of one of the first and second modular thermal isolation barriers substantially entirely envelops the bifurcated distal end of the seal portion of the other of the first and second modular thermal isolation barriers.

9. The data processing equipment structure of claim 1, wherein the seal portion of each of the first and second modular thermal isolation barriers includes convex and concave portions at a distal end such that the seal portions are matingly paired with one another.

10. The data processing equipment structure of claim 1, wherein the seal portion of each of the first and second modular thermal isolation barriers includes one or more protrusions at a distal end such that the seal portions are interlocked with one another.

11. A data processing equipment structure comprising:
a frame structure that includes a rigid support structure; and
a modular thermal isolation barrier having a generally uniform cross-sectional shape along its length and including:
an edge seal having a seal portion and a base portion, the base portion including a panel-receiving end channel and at least one side channel; and
a panel, an edge of which is disposed within the panel-receiving end channel;
wherein the rigid support structure has a generally uniform cross-sectional shape along its length and is coupled to the edge seal of the modular thermal isolation barrier at the at least one side channel, thereby providing structural support to the modular thermal isolation barrier;
wherein the rigid support structure includes a plurality of channels, extending along the length thereof, for coupling the rigid support structure to one or more other structures; and
wherein the seal portion of the modular thermal isolation barrier engages and is deflected by a side of an equipment enclosure, thereby preventing the passage of air through a gap between the modular thermal isolation barrier and the equipment enclosure.

12. The data processing equipment structure of claim 11, wherein at least one of the plurality of channels of the rigid support structure is ridged to accommodate a threaded fastener.

13. The data processing equipment structure of claim 11, wherein the rigid support structure includes a pair of opposed retention flanges for coupling the rigid support structure to the edge seal.

14. The data processing equipment structure of claim 11, wherein the panel is oriented generally perpendicularly relative to the side of the equipment enclosure.

15. The data processing equipment structure of claim 11, wherein the seal portion of the modular thermal isolation barrier is bifurcated at a distal end.

16. A data processing equipment structure comprising:
a frame structure that includes a rigid support structure; and
first and second modular thermal isolation barriers for use in sealing a periphery of the frame structure, each of the first and second modular thermal isolation barriers having a generally uniform cross-sectional shape along its length and each including:
an edge seal having a seal portion and a base portion, the base portion including a panel-receiving end channel defined between opposite sides of the base portion, and the base portion further including at least one outward-facing side channel defined between hooked ends of one of the sides of the base portion; and a panel, an edge of which is disposed within the panel-receiving end channel;

wherein the rigid support structure has a generally uniform cross-sectional shape along its length and includes a pair of opposed retention flanges;

wherein the rigid support structure is coupled to the edge seal of the first modular thermal isolation barrier at the at least one outward-facing side channel of the base portion, with the pair of opposed retention flanges of the rigid support structure seated within the at least one outward-facing side channel;

wherein the rigid support structure provides structural support to the first modular thermal isolation barrier; and wherein the seal portion of the first modular thermal isolation barrier directly engages the seal portion of the second modular thermal isolation barrier, thereby preventing the passage of air through a gap between the first and second modular thermal isolation barriers.

17. The data processing equipment structure of claim 16, wherein the rigid support structure includes a plurality of channels for coupling the rigid support structure to one or more other structures.

18. The data processing equipment structure of claim 16, wherein seal portions of the first and second modular thermal isolation barriers interlock with one another to prevent the passage of air through a gap between the first and second modular thermal isolation barriers.

19. The data processing equipment structure of claim 16, wherein the seal portion of each of the first and second modular thermal isolation barriers is bifurcated at a distal end.

20. The data processing equipment structure of claim 19, wherein the bifurcated distal end of the seal portion of one of the first and second modular thermal isolation barriers substantially entirely envelops the bifurcated distal end of the seal portion of the other of the first and second modular thermal isolation barriers.

\* \* \* \* \*